(12) United States Patent
Chen et al.

(10) Patent No.: US 11,120,997 B2
(45) Date of Patent: Sep. 14, 2021

(54) SURFACE TREATMENT FOR ETCH TUNING

(71) Applicant: Taiwan Semiconductor Manufacturing Co., Ltd., Hsinchu (TW)

(72) Inventors: Shih-Chiang Chen, Taichung (TW); Chun-Hung Lee, Hsinchu (TW); Ryan Chia-jen Chen, Chiayi (TW); Hung-Wei Lin, Hsinchu (TW); Lung-Kai Mao, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/118,684

(22) Filed: Aug. 31, 2018

(65) Prior Publication Data
US 2020/0075342 A1     Mar. 5, 2020

(51) Int. Cl.
*H01L 21/3105* (2006.01)
*H01L 21/311* (2006.01)
(Continued)

(52) U.S. Cl.
CPC .. *H01L 21/31051* (2013.01); *H01L 21/02271* (2013.01); *H01L 21/31144* (2013.01); *H01L 21/76224* (2013.01); *H01L 21/823431* (2013.01); *H01L 21/823481* (2013.01); *H01L 27/0886* (2013.01); *H01L 29/0649* (2013.01); *H01L 29/6681* (2013.01); *H01L 29/66545* (2013.01)

(58) Field of Classification Search
None
See application file for complete search history.

(56) References Cited

U.S. PATENT DOCUMENTS

| 4,791,073 A | * | 12/1988 | Nagy | ............... H01L 21/31055 |
| | | | | 438/435 |
| 4,871,689 A | * | 10/1989 | Bergami | ............ H01L 21/3145 |
| | | | | 438/427 |

(Continued)

FOREIGN PATENT DOCUMENTS

| KR | 20140060253 A | 5/2014 |
| KR | 20160134442 A | 11/2016 |

(Continued)

*Primary Examiner* — David E Graybill
(74) *Attorney, Agent, or Firm* — Slater Matsil, LLP

(57) ABSTRACT

Generally, this disclosure provides examples relating to tuning etch rates of dielectric material. In an embodiment, a dielectric material is conformally deposited in first and second trenches in a substrate. Merged lateral growth fronts of the first dielectric material in the first trench form a seam in the first trench. The dielectric material is treated. The treating causes a species to be on first and second upper surfaces of the dielectric material in the first and second trenches, respectively, to be in the seam, and to diffuse into the respective dielectric material in the first and second trenches. After the treating, the respective dielectric material is etched. A ratio of an etch rate of the dielectric material in the second trench to an etch rate of the dielectric material in the first trench is altered by presence of the species in the dielectric material during the etching.

20 Claims, 17 Drawing Sheets

US 11,120,997 B2
Page 2

(51) Int. Cl.
*H01L 29/66* (2006.01)
*H01L 29/06* (2006.01)
*H01L 21/02* (2006.01)
*H01L 21/762* (2006.01)
*H01L 21/8234* (2006.01)
*H01L 27/088* (2006.01)

(56) References Cited

U.S. PATENT DOCUMENTS

| | | | | |
|---|---|---|---|---|
| 5,316,965 | A * | 5/1994 | Philipossian | H01L 21/3105 148/DIG. 50 |
| 5,492,858 | A * | 2/1996 | Bose | H01L 21/76229 438/437 |
| 5,702,976 | A * | 12/1997 | Schuegraf | H01L 21/76224 438/424 |
| 6,107,159 | A * | 8/2000 | Chuang | H01L 21/763 257/E21.548 |
| 6,180,490 | B1 * | 1/2001 | Vassiliev | H01L 21/76232 257/E21.549 |
| 6,245,641 | B1 * | 6/2001 | Shiozawa | H01L 21/76229 438/427 |
| 6,265,282 | B1 * | 7/2001 | Lane | H01L 21/76224 257/E21.546 |
| 6,914,316 | B2 * | 7/2005 | Yun | H01L 21/76229 257/506 |
| 6,933,206 | B2 * | 8/2005 | Beintner | H01L 21/76229 257/510 |
| 7,033,909 | B2 * | 4/2006 | Kim | H01L 21/76229 257/E21.548 |
| 7,166,519 | B2 * | 1/2007 | Ahn | H01L 21/76229 257/E21.548 |
| 7,235,459 | B2 * | 6/2007 | Sandhu | H01L 21/76229 257/E21.548 |
| 7,416,987 | B2 * | 8/2008 | Hieda | H01L 21/3125 438/700 |
| 7,691,722 | B2 * | 4/2010 | Zhou | H01L 21/76224 438/427 |
| 7,709,345 | B2 * | 5/2010 | Sandhu | H01L 27/10844 438/424 |
| 7,838,390 | B2 * | 11/2010 | Kim | H01L 21/76229 438/438 |
| 7,968,422 | B2 * | 6/2011 | Hautala | H01L 21/02321 438/424 |
| 7,994,020 | B2 * | 8/2011 | Lin | H01L 29/66795 438/443 |
| 8,012,847 | B2 * | 9/2011 | Patraw | H01L 21/76229 438/427 |
| 8,129,238 | B2 * | 3/2012 | Kim | H01L 21/76229 438/243 |
| 8,329,587 | B2 * | 12/2012 | Liang | H01L 21/316 438/697 |
| 8,466,067 | B2 * | 6/2013 | Liang | H01L 21/3105 438/697 |
| 8,476,142 | B2 * | 7/2013 | Kweskin | H01L 21/76229 438/427 |
| 8,519,484 | B2 * | 8/2013 | Kim | H01L 21/76229 257/374 |
| 8,536,017 | B2 * | 9/2013 | Kadoshima | H01L 21/76229 438/425 |
| 8,685,832 | B2 * | 4/2014 | Watanabe | H01L 21/76229 438/427 |
| 8,685,867 | B1 * | 4/2014 | Danek | H01L 21/3105 438/787 |
| 8,686,535 | B2 * | 4/2014 | Sandhu | H01L 27/10844 257/510 |
| 8,716,154 | B2 * | 5/2014 | Bhatia | H01L 21/02164 438/790 |
| 8,895,446 | B2 * | 11/2014 | Peng | H01L 29/0649 438/700 |
| 8,927,389 | B2 * | 1/2015 | Byun | H01L 21/76229 438/427 |
| 8,975,152 | B2 * | 3/2015 | Hong | H01L 21/02164 438/427 |
| 9,006,812 | B2 * | 4/2015 | Takayama | H01L 21/76229 257/315 |
| 9,012,300 | B2 * | 4/2015 | Sie | H01L 21/76232 438/400 |
| 9,087,870 | B2 * | 7/2015 | Tong | H01L 21/76224 |
| 9,281,362 | B2 * | 3/2016 | Lee | H01L 29/0649 |
| 9,318,369 | B2 * | 4/2016 | Park | H01L 21/76 |
| 9,324,790 | B2 * | 4/2016 | Akarvardar | H01L 27/0886 |
| 9,355,886 | B2 * | 5/2016 | Swaminathan | H01L 21/02126 |
| 9,406,682 | B2 * | 8/2016 | Basker | H01L 29/66795 |
| 9,455,331 | B1 * | 9/2016 | Cai | H01L 27/0886 |
| 9,508,597 | B1 * | 11/2016 | Liu | H01L 29/0657 |
| 9,508,604 | B1 * | 11/2016 | Sung | H01L 29/6656 |
| 9,514,976 | B2 * | 12/2016 | Sandhu | H01L 21/76237 |
| 9,552,978 | B1 * | 1/2017 | Huang | H01L 21/02126 |
| 9,564,486 | B2 * | 2/2017 | Akarvardar | H01L 29/785 |
| 9,576,956 | B2 * | 2/2017 | Cai | H01L 27/0886 |
| 9,659,964 | B2 * | 5/2017 | Basker | H01L 29/6653 |
| 9,691,765 | B1 * | 6/2017 | Bi | H01L 21/31111 |
| 9,735,156 | B1 * | 8/2017 | Cha | H01L 27/0207 |
| 9,799,529 | B2 * | 10/2017 | Yen | H01L 21/31055 |
| 9,865,496 | B2 * | 1/2018 | Kim | H01L 21/02164 |
| 9,941,279 | B2 * | 4/2018 | Ching | H01L 27/088 |
| 9,978,634 | B2 * | 5/2018 | Yen | H01L 29/0649 |
| 9,991,205 | B2 * | 6/2018 | Chang | H01L 23/53257 |
| 10,020,229 | B2 * | 7/2018 | Bi | H01L 21/76229 |
| 10,083,871 | B2 * | 9/2018 | Cheng | H01L 27/0886 |
| 10,269,802 | B2 * | 4/2019 | Lin | H01L 27/0886 |
| 10,290,635 | B2 * | 5/2019 | Ching | H01L 29/456 |
| 10,332,746 | B1 * | 6/2019 | Yu | H01L 21/0262 |
| 10,347,751 | B2 * | 7/2019 | Ching | H01L 21/823814 |
| 10,374,058 | B2 * | 8/2019 | Su | H01L 21/82345 |
| 10,510,580 | B2 * | 12/2019 | Lin | H01L 27/0924 |
| 10,510,865 | B2 * | 12/2019 | Yu | H01L 21/28123 |
| 10,510,873 | B2 * | 12/2019 | Ching | H01L 21/823821 |
| 10,510,874 | B2 * | 12/2019 | Ching | H01L 27/0886 |
| 10,580,864 | B2 * | 3/2020 | Tung | H01L 29/165 |
| 10,608,085 | B2 * | 3/2020 | Alian | H01L 21/02107 |
| 10,643,883 | B2 * | 5/2020 | Chen | H01L 21/02554 |
| 10,727,064 | B2 * | 7/2020 | Yu | H01L 29/66545 |
| 10,763,255 | B2 * | 9/2020 | Ching | H01L 27/0886 |
| 2001/0006839 | A1 * | 7/2001 | Yeo | H01L 21/76229 438/435 |
| 2004/0016987 | A1 * | 1/2004 | Sawada | H01L 21/76245 257/510 |
| 2004/0032006 | A1 * | 2/2004 | Yun | H01L 21/76229 257/510 |
| 2005/0009293 | A1 * | 1/2005 | Kim | H01L 21/76229 438/424 |
| 2005/0056888 | A1 * | 3/2005 | Youn | H01L 29/66795 257/331 |
| 2005/0079730 | A1 * | 4/2005 | Beintner | H01L 21/76229 438/758 |
| 2005/0142795 | A1 * | 6/2005 | Ahn | H01L 21/76229 438/400 |
| 2006/0046425 | A1 * | 3/2006 | Sandhu | H01L 27/1052 438/424 |
| 2006/0134868 | A1 * | 6/2006 | Yoon | H01L 29/66795 438/283 |
| 2007/0066005 | A1 * | 3/2007 | Hieda | H01L 21/02337 438/207 |
| 2007/0207590 | A1 * | 9/2007 | Kiyotoshi | H01L 21/823475 438/424 |
| 2007/0210366 | A1 * | 9/2007 | Sandhu | H01L 27/10844 257/305 |
| 2007/0218645 | A1 * | 9/2007 | Zhou | H01L 21/311 438/427 |
| 2008/0166888 | A1 * | 7/2008 | Hsu | H01L 21/02274 438/787 |
| 2009/0098706 | A1 * | 4/2009 | Kim | H01L 21/76229 438/438 |
| 2009/0185774 | A1 * | 7/2009 | Kiyota | G02B 6/122 385/14 |
| 2009/0194810 | A1 * | 8/2009 | Kiyotoshi | H01L 21/84 257/326 |

(56) References Cited

U.S. PATENT DOCUMENTS

| | | | |
|---|---|---|---|
| 2009/0314963 A1* | 12/2009 | Hautala | H01J 37/08 250/492.21 |
| 2010/0015778 A1* | 1/2010 | Lin | H01L 21/823431 438/443 |
| 2010/0200946 A1* | 8/2010 | Hautala | H01L 21/31608 257/506 |
| 2010/0219501 A1* | 9/2010 | Sandhu | G11C 11/401 257/510 |
| 2011/0081782 A1* | 4/2011 | Liang | C23C 16/345 438/697 |
| 2011/0165757 A1* | 7/2011 | Kim | H01L 21/76229 438/427 |
| 2011/0212620 A1* | 9/2011 | Liang | H01L 21/316 438/692 |
| 2011/0250731 A1* | 10/2011 | Kweskin | H01L 21/67017 438/400 |
| 2012/0132976 A1* | 5/2012 | Kim | H01L 21/76229 257/315 |
| 2012/0208346 A1* | 8/2012 | Kadoshima | H01L 21/76229 438/425 |
| 2012/0225565 A1* | 9/2012 | Bhatia | H01L 21/02164 438/763 |
| 2012/0252182 A1* | 10/2012 | Byun | H01L 27/10894 438/382 |
| 2012/0276713 A1* | 11/2012 | Miyahara | H01L 21/76224 438/427 |
| 2013/0017661 A1* | 1/2013 | Wei | H01L 21/26533 438/303 |
| 2013/0052795 A1* | 2/2013 | Watanabe | H01L 21/76229 438/427 |
| 2013/0309870 A1* | 11/2013 | Hong | H01L 21/306 438/700 |
| 2014/0094017 A1* | 4/2014 | Sie | H01L 21/76229 438/424 |
| 2014/0134827 A1 | 5/2014 | Swanninathan et al. | |
| 2014/0231919 A1* | 8/2014 | Peng | H01L 29/0649 257/368 |
| 2014/0241053 A1* | 8/2014 | Sandhu | H01L 21/76237 365/182 |
| 2014/0284689 A1* | 9/2014 | Takayama | H01L 27/11568 257/324 |
| 2014/0312455 A1* | 10/2014 | Park | H01L 21/76229 257/506 |
| 2014/0353795 A1* | 12/2014 | Tong | H01L 21/31155 257/506 |
| 2015/0091127 A1* | 4/2015 | Lee | H01L 21/76229 257/506 |
| 2015/0137308 A1* | 5/2015 | Akarvardar | H01L 21/76229 257/506 |
| 2015/0162168 A1 | 6/2015 | Oehrlein et al. | |
| 2015/0179259 A1* | 6/2015 | Kim | G11C 7/1003 711/125 |
| 2015/0357232 A1* | 12/2015 | Ujihara | H01L 21/02326 438/427 |
| 2015/0372080 A1* | 12/2015 | Akarvardar | H01L 27/0886 257/369 |
| 2016/0071932 A1* | 3/2016 | Sung | H01L 21/76224 257/369 |
| 2016/0079248 A1* | 3/2016 | Basker | H01L 27/10879 257/347 |
| 2016/0254179 A1* | 9/2016 | Yen | H01L 21/31056 257/506 |
| 2016/0336320 A1 | 11/2016 | Lin | |
| 2017/0012042 A1* | 1/2017 | Cai | H01L 29/66795 |
| 2017/0186642 A1* | 6/2017 | Kim | H01L 21/02362 |
| 2017/0213823 A1* | 7/2017 | Cha | H01L 29/0649 |
| 2017/0263503 A1* | 9/2017 | Bi | H01L 21/823821 |
| 2017/0271169 A1* | 9/2017 | Yen | H01L 21/31055 |
| 2017/0278928 A1* | 9/2017 | Tung | H01L 21/02634 |
| 2017/0316935 A1 | 11/2017 | Tan et al. | |
| 2017/0338225 A1* | 11/2017 | Ching | H01L 21/76224 |
| 2018/0040559 A1 | 2/2018 | Chang et al. | |
| 2018/0138081 A1* | 5/2018 | Wu | H01L 21/76283 |
| 2018/0182849 A1* | 6/2018 | Alian | H01L 29/408 |
| 2018/0233500 A1* | 8/2018 | Cheng | H01L 29/42392 |
| 2018/0366323 A1* | 12/2018 | Huang | H01L 21/02323 |
| 2019/0006486 A1* | 1/2019 | Ching | H01L 29/0653 |
| 2019/0035785 A1* | 1/2019 | Ching | H01L 29/7851 |
| 2019/0067444 A1* | 2/2019 | Ching | H01L 21/823807 |
| 2019/0088762 A1* | 3/2019 | Su | H01L 29/6681 |
| 2019/0103304 A1* | 4/2019 | Lin | H01L 21/823821 |
| 2019/0164887 A1* | 5/2019 | Wang | H01L 21/28562 |
| 2019/0165127 A1* | 5/2019 | Ching | H01L 29/6681 |
| 2019/0214296 A1* | 7/2019 | Wang | H01L 21/76879 |
| 2019/0267375 A1* | 8/2019 | Ching | H01L 21/743 |
| 2019/0287972 A1* | 9/2019 | Hafez | H01L 21/76895 |
| 2019/0305082 A1* | 10/2019 | Ching | H01L 21/823878 |
| 2019/0318932 A1* | 10/2019 | Yu | H01L 29/66795 |
| 2019/0319113 A1* | 10/2019 | Yu | H01L 21/28123 |
| 2019/0334014 A1* | 10/2019 | Ching | H01L 21/823814 |
| 2019/0363177 A1* | 11/2019 | Su | H01L 21/823821 |
| 2019/0385898 A1* | 12/2019 | Peng | H01L 21/02337 |
| 2019/0393325 A1* | 12/2019 | Chang | H01L 29/4966 |
| 2020/0006224 A1* | 1/2020 | Wang | H01L 23/5283 |
| 2020/0058649 A1* | 2/2020 | Ching | H01L 29/6681 |
| 2020/0075342 A1* | 3/2020 | Chen | H01L 21/31051 |
| 2020/0075745 A1* | 3/2020 | Yu | H01L 21/28123 |
| 2020/0105583 A1* | 4/2020 | Wang | H01L 21/823418 |
| 2020/0118867 A1* | 4/2020 | Lin | H01L 21/823431 |
| 2020/0119159 A1* | 4/2020 | Ching | H01L 21/823878 |
| 2020/0119160 A1* | 4/2020 | Ching | H01L 21/0228 |

FOREIGN PATENT DOCUMENTS

| | | |
|---|---|---|
| KR | 20180015562 A | 2/2018 |
| TW | 201628087 A | 8/2016 |
| TW | 201735352 A | 10/2017 |
| WO | 2018063365 A1 | 4/2018 |

* cited by examiner

SURFACE TREATMENT FOR ETCH TUNING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
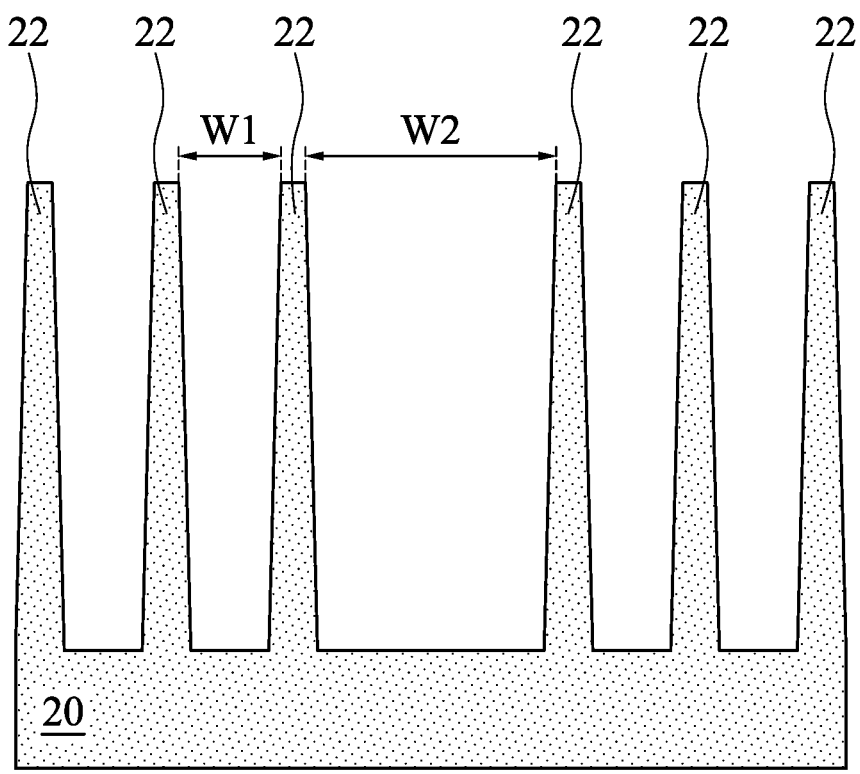
FIGS. 1A-1B, 2 through 5, and 6A-6B illustrate views of respective intermediate structures at respective stages during an example process for forming isolation structures and a dummy fin for Fin Field Effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to tuning etch rates of dielectric material, such as in Shallow Trench Isolations (STIs), and dielectric material of dummy fins. More specifically, example embodiments described herein relate to treating various surfaces of dielectric materials to control etch rates that may result from a loading effect and/or an effect from the presence of seams in the dielectric materials. Treatments may reduce the loading effect and/or effect from the presence of seams such that differences in etch rates are reduced, or may increase the loading effect and/or effect from the presence of seams such that differences in etch rates may increase. Tuning etch rates in such a way can achieve fin heights that may be desirable for operation of devices. Other benefits can be achieved.

Example embodiments described herein are described in the context of forming isolation structures, such as STIs, between device fins and forming dummy fins in Front End Of the Line (FEOL) processing. The device fins may be used to form Fin Field Effect Transistors (FinFETs). Other embodiments may be implemented in other contexts. Example embodiments may have broad applicability to control etch rates among different structures and/or materials. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIGS. 1A-1B, 2 through 5, and 6A-6B illustrate views of respective intermediate structures at respective stages during an example process for forming isolation structures and a dummy fin for FinFETs in accordance with some embodiments. FIG. 7 is a flow chart of the example process 100 for forming the isolation structures and the dummy fin in accordance with some embodiments.

Figure 1B:
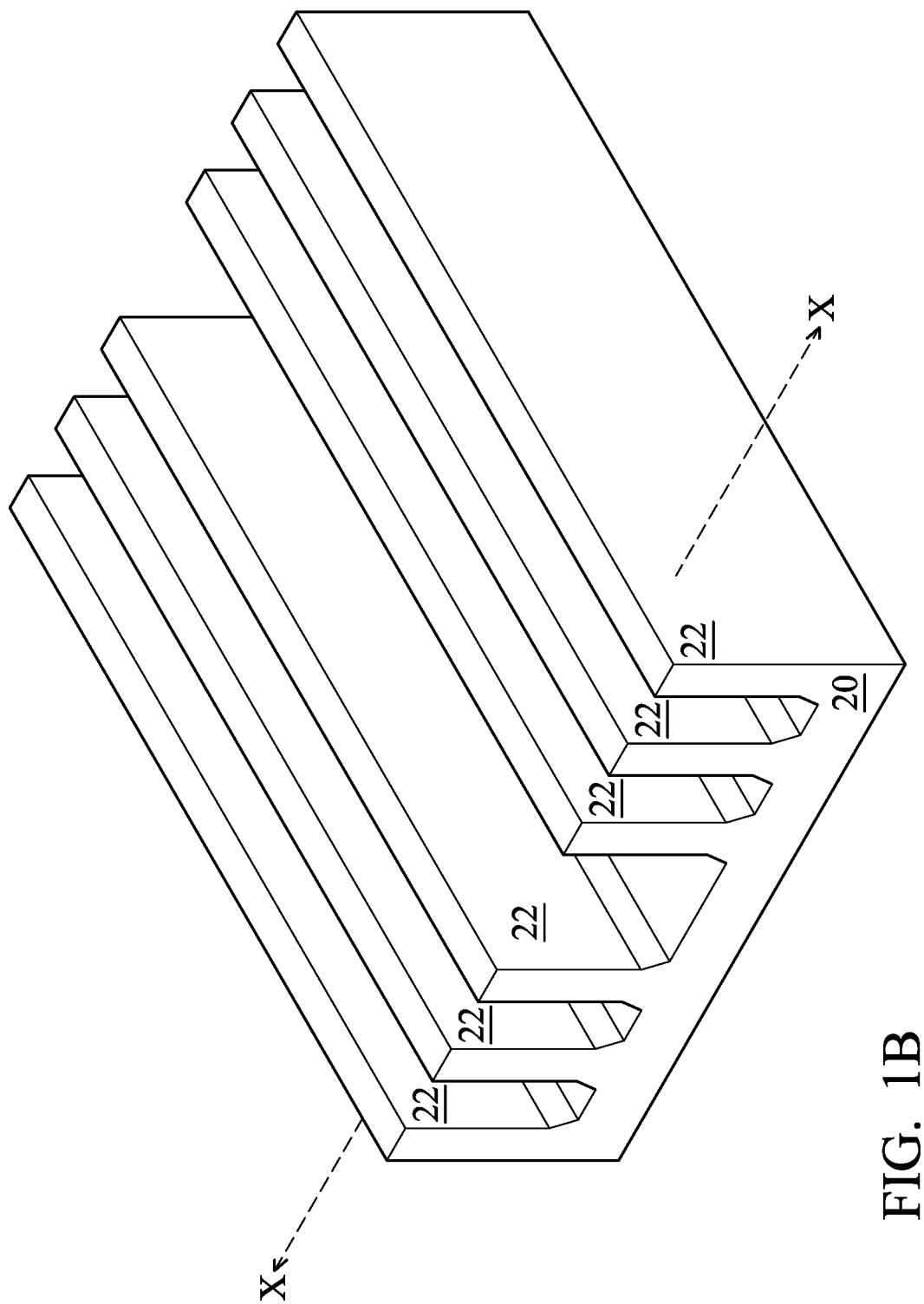

FIG. 1A illustrates a cross-sectional view of an intermediate structure at a stage of the example method, and FIG. 1B is a perspective view of the intermediate structure. The intermediate structure includes device fins 22 formed on a semiconductor substrate 20. The semiconductor substrate 20 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 20 may include an elemental semiconductor such as silicon (Si) or germanium (Ge); a compound semiconductor including; an alloy semiconductor; or a combination thereof.

The device fins 22 are formed on the semiconductor substrate 20, such as by etching trenches in the semiconductor substrate 20 to form the device fins 22 (which include a semiconductor material of the semiconductor substrate 20). The device fins 22 may be patterned in the semiconductor substrate 20 by any suitable method. For example, the device fins 22 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the device fins 22.

FIG. 1A illustrates an example first width W1 and an example second width W2 of trenches etched into the semiconductor substrate 20 to form the device fins 22. The first width W1 may be a small dimension, such as less than or equal to about 20 nm (e.g., in a range from about 10 nm to about 20 nm). One or more trenches having the first width W1 may have a high aspect ratio (e.g., a ratio of a depth of the trench to the first width W1), such as equal to or greater than 7.5. The second width W2 is larger than the first width W1. In some examples, the second width W2 is equal to or greater than about 40 nm (e.g., in a range from about 40 nm to about 200 nm), depending on a design of the structure. In various examples, trenches can have various widths between neighboring device fins 22, which can be in any configuration or pattern of widths. The illustration in the figures is merely an example.

FIG. 1B further illustrates a reference cross-section X-X that corresponds to cross-sectional view of some figures. Cross-section X-X is in a plane across and intersecting the device fins 22 on the semiconductor substrate 20. FIGS. 1A, 2 through 5, and 6A illustrate cross-sectional views at various instances of processing corresponding with the reference cross-section X-X.

Figure 2:
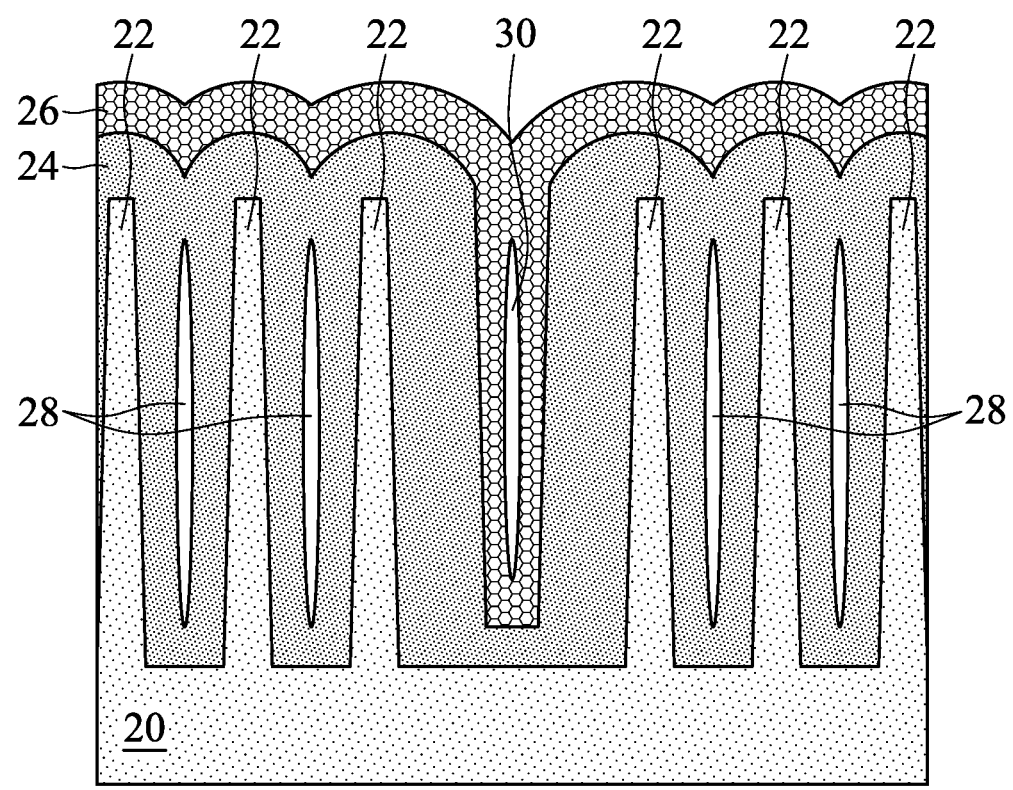

FIG. 2 illustrates the formation of a first conformal dielectric material 24 on the device fins 22 and in the trenches in operation 102 of the process 100, and the formation of a second conformal dielectric material 26 on the first conformal dielectric material 24 and in wide trenches in operation 104 of the process 100. As will become apparent subsequently, the second conformal dielectric material 26 is implemented to form a dummy fin, and the first conformal dielectric material 24 is implemented to form isolation structures.

In some examples, the first conformal dielectric material 24 is an oxide-containing dielectric material, such as silicon oxycarbon nitride ($SiO_xC_yN_z$), silicon oxide ($SiO_x$), silicon oxynitride ($SiO_xN_y$), the like, or a combination thereof. The first conformal dielectric material 24 is deposited using a conformal deposition process, such as Atomic Layer Deposition (ALD), Plasma Enhanced Chemical Vapor Deposition (PECVD), or the like. In some examples, the first conformal dielectric material 24 is silicon oxycarbon nitride ($SiO_xC_yN_z$) deposited by ALD.

The ALD process for depositing the first conformal dielectric material 24 includes performing one or more cycles, where each cycle includes sequentially pulsing a precursor gas in a chamber, purging the chamber, pulsing a reactant gas in the chamber, and purging the chamber. Example precursor gases and/or reactant gases include hydrochlorodisalane, triethylamine ($N(CH_2CH_3)_3$), propene ($C_3H_6$), oxygen ($O_2$), the like, or a combination thereof. The precursor gas and/or the reactant gas may further be mixed with a carrier gas, such as argon (Ar), helium (He), or the like, during respective pulsing during the ALD process. The ALD process may be implemented with a process temperature in a range from about 400° C. to about 800° C. A pressure during the pulsing operations of the cycle of the ALD process may be in a range from about 1 Torr to about 25 Torr.

The first conformal dielectric material 24 is deposited to a thickness that is at least half of the first width W1. Hence, due to the conformal deposition and the merging of lateral growth fronts from opposing sidewalls of device fins 22 when the thickness reaches approximately half of the first width W1, the first conformal dielectric material 24 fills narrow trenches defined between neighboring device fins 22. The thickness of the first conformal dielectric material 24 is not sufficient to fill wider trenches in which a dummy fin is to be formed, such as trenches having the second width W2. The merging of lateral growth fronts from opposing sidewalls of device fins 22 within the narrow trenches causes seams 28, which may also include larger voids, in the first conformal dielectric material 24 in the narrow trenches in some examples. Merging of the lateral growth fronts may first occur at top portions of the device fins 22. By merging first at the top portions of the device fins 22, a larger void may result at the seam 28 in depths of the respective narrow trench since further deposition in those depths may be prevented by the merging at the top portions of the device fins 22.

In some examples, the second conformal dielectric material 26 is a carbon-containing dielectric material, such as silicon oxycarbon nitride ($SiO_xC_yN_z$), silicon carbide ($SiC_x$), silicon carbon nitride ($SiC_xN_y$), the like, or a combination thereof. The second conformal dielectric material 26 is deposited using a conformal deposition process, such as ALD, PECVD, or the like. In some examples, the second conformal dielectric material 26 is silicon oxycarbon nitride ($SiO_xC_yN_z$) deposited by ALD and has a higher concentration of carbon or nitrogen than the first conformal dielectric material 24.

The ALD process for depositing the second conformal dielectric material 26 includes performing one or more cycles, where each cycle includes sequentially pulsing a precursor gas in a chamber, purging the chamber, pulsing a reactant gas in the chamber, and purging the chamber. Example precursor gases and/or reactant gases include hydrochlorodisalane, triethylamine ($N(CH_2CH_3)_3$), propene ($C_3H_6$), oxygen ($O_2$), ammonia ($NH_3$), the like, or a combination thereof. The precursor gas and/or the reactant gas may further be mixed with a carrier gas, such as argon (Ar), helium (He), or the like, during respective pulsing during the ALD process. The ALD process may be implemented with a process temperature in a range from about 400° C. to about 800° C. A pressure during the pulsing operations of the cycle of the ALD process may be in a range from about 1 Torr to about 50 Torr.

The second conformal dielectric material 26 is deposited to a thickness that is at least half of the remaining second width W2 that was not filled by the deposition of the first conformal dielectric material 24. Hence, due to the conformal deposition and the merging of lateral growth fronts from opposing sidewalls of the first conformal dielectric material 24 in the wider trenches when the thickness reaches approximately half of the remaining second width W2 that was not filled in the wider trenches, the second conformal dielectric material 26 fills the remaining portions of the wider trenches. Similar to what was described above with respect to the first conformal dielectric material 24, the merging of lateral growth fronts of the second conformal dielectric material 26 within the wider trenches causes seams 30, which may also include larger voids, in the second conformal dielectric material 26 in the wider trenches in some examples.

Figure 3:
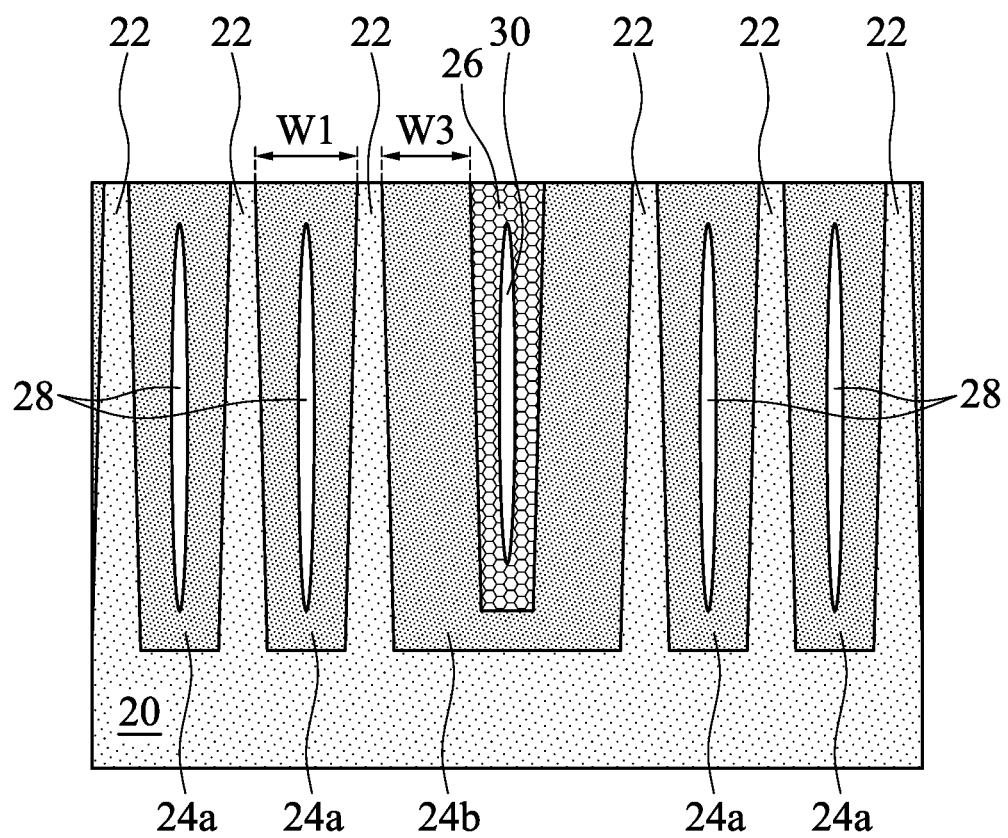

FIG. 3 illustrates planarizing the second conformal dielectric material 26 and first conformal dielectric material 24 with top surfaces of the device fins 22 in operation 106 of the process 100. The second conformal dielectric material 26 and first conformal dielectric material 24 are planarized, such as by a chemical mechanical planarization (CMP), to the top surfaces of the device fins 22. Portions of the first conformal dielectric material 24 form first isolation structures 24a in narrow trenches and form second isolation structures 24b in wider trenches in which a dummy fin is formed. The second conformal dielectric material 26 forms a dummy fin in the wider trench. The dummy fin is embedded in the second isolation structure 24b. FIG. 3 further illustrates the first width W1 of the first isolation structures 24a (which corresponds to the first width W1 of the narrow trench in FIG. 1A), and illustrates a third width W3 of the second isolation structure 24b. The third width W3 corresponds to the thickness of the first conformal dielectric material 24. In some examples, the third width W3 is equal to or greater than half of the first width W1 but less than the first width W1, and more particularly, in some examples, is equal to or greater than half of the first width W1 but less than three-quarters of the first width W1. In other examples, the third width W3 can be equal to or greater than the first width W1.

Figure 4:
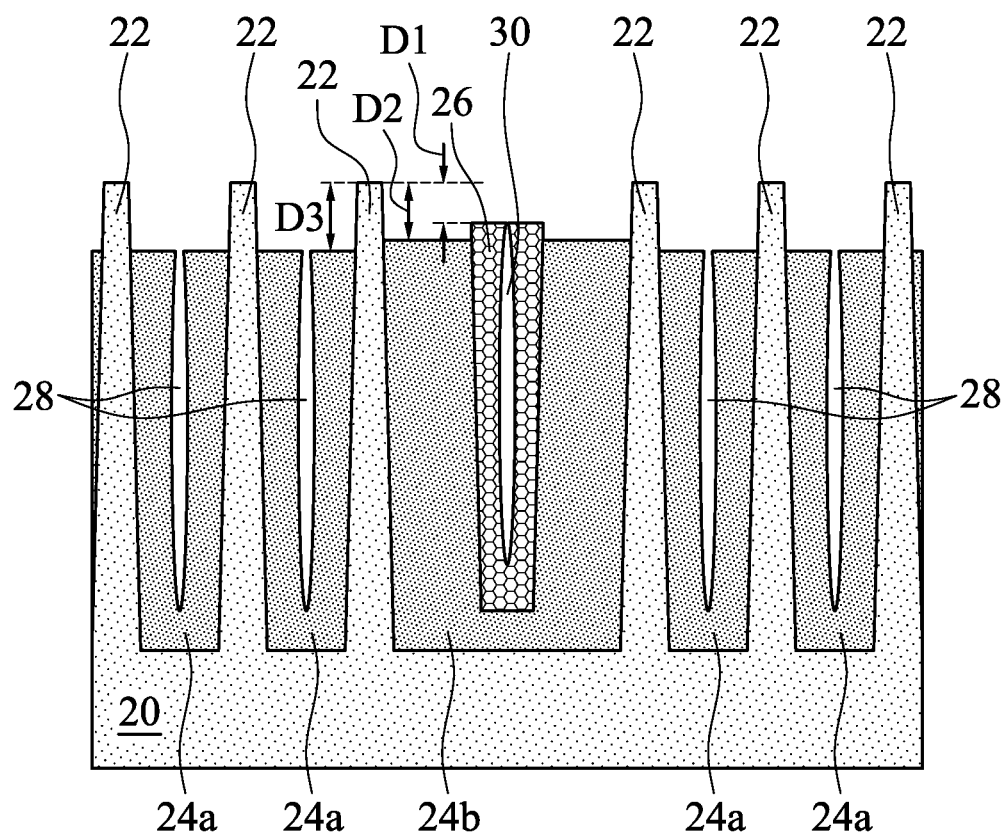
Figure 5:
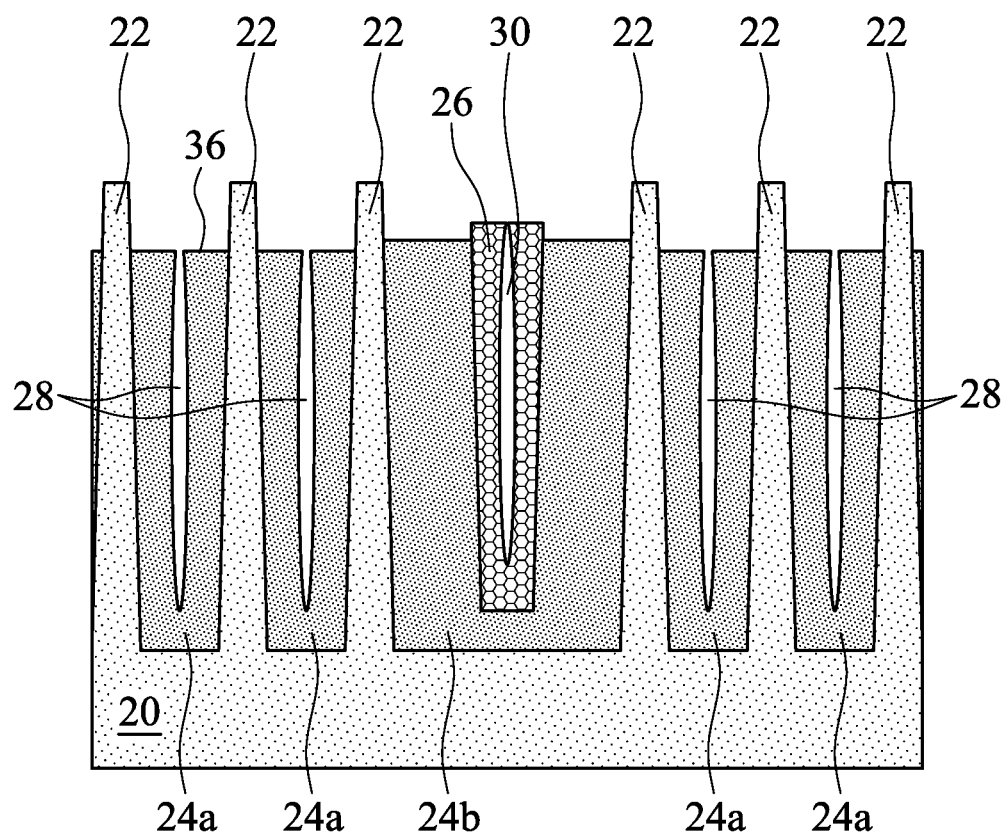

FIGS. 4 and 5 illustrate a cyclic partial etch and treatment process. In FIG. 4 and in operation 108 of the process 100, a partial etch process is performed to recess the first isolation structures 24a and the second isolation structures 24b. The partial etch process may also recess the second conformal dielectric material 26. As shown in FIG. 4, different structures are etched by different etch rates, which causes the etch process to etch to different depths. As illustrated, the second conformal dielectric material 26 is etched to a first depth D1 from the top surfaces of the device fins 22; the second isolation structure 24b is etched to a second depth D2 from the top surfaces of the device fins 22; and the first isolation structures 24a are etched to a third depth D3 from the top surfaces of the device fins 22. The third depth D3 is greater than the second depth D2, which is greater than the first depth D1. Various factors result in the different etch rates. The different materials of the second conformal dielectric material 26 and the first conformal dielectric material 24 (e.g., different carbon or nitrogen concentrations) can result in different etch rates between (i) the second conformal dielectric material 26 and (ii) the first isolation structures 24a and second isolation structure 24b. Another factor is the loading effect. Compared between the first isolation structures 24a and the second isolation structure 24b, for example, the contiguous upper area that is etched by the etch process is larger on upper surfaces of the first isolation structures 24a (e.g., area resulting from the first width W1 is greater than the area resulting from the third width W3). Hence, the loading effect indicates that the first isolation structures 24a are etched at a greater rate than the second isolation structure 24b. Another factor may be the presence of the seams 28 and 30. The etchant may penetrate the seams 28 and 30, which can result in a larger surface for the etchant to etch.

In some examples, the partial etch process implements an isotropic etch process, although in other examples, the partial etch process implements an anisotropic etch process. In some examples, an isotropic etch process is a dry process or a wet process. In some examples, a dry isotropic etch process is implemented for the partial etch process. Further, in some specific examples, a dry isotropic etch process includes using a hydrofluoric (HF) gas and/or ammonia ($NH_3$) gas, which may be implemented in a chamber at a pressure less than about 1 Torr (e.g., in a range from about 100 mTorr to about 1 Torr) and at a temperature less than about 130° C. (e.g., in a range from about 5° C. to about 130° C., such as about room temperature (e.g., about 23° C.)).

In FIG. 5 and in operation 110 of the process 100, a treatment process is performed to treat exposed surfaces 36 of the first isolation structures 24a, the second isolation structures 24b, and the second conformal dielectric material 26. In some examples, the treatment process reduces the loading effect and/or the effect of seams 28 and 30 being present during the subsequent etch process. The treatment process includes a plasma process in some examples. In some examples, the plasma process includes a remote plasma with a capacitively coupled plasma (CCP) source. Example gases used to implement the plasma process include carbon monoxide (CO), methane ($CH_4$), ammonia ($NH_3$), the like, or a combination thereof, which may further include a carrier gas such as argon (Ar), hydrogen ($H_2$), or the like. A pressure of the plasma process can be in a range from about 1 Torr to about 5 Torr, and a temperature of the plasma process can be in a range from about 20° C. to about 75° C., such as about room temperature (e.g., 23° C.). A power of the CCP source can be in a range from about 100 W to about 400 W at an appropriate frequency, such as 13.56 MHz. Parameters of the plasma process may be tuned, to amounts within or outside of ranges described above, to obtain different results, such as the depth to which a species diffuses into a material, which can have an effect on a subsequent etch process.

The plasma process causes a species to be at the exposed surfaces 36 of the first isolation structures 24a, second isolation structure 24b, and second conformal dielectric material 26 and diffused a depth from those exposed surfaces 36 in the respective structures. The presence of the species at the exposed surfaces 36 and to some depth from the exposed surfaces 36 reduces the loading effect and/or the effect of seams 28 and 30 being present during the subsequent etch process. The presence of the species reduces the etch rates of the first isolation structures 24a, second isolation structure 24b, and second conformal dielectric material 26 in the subsequent partial etch process compared to when the species from the treatment is absent. However, due to different sizes of surface areas of the first isolation structures 24a and second isolation structure 24b, a ratio of the etch rate of the second isolation structure 24b to the etch rate of the first isolation structure 24a increases due to the presence of the species in the subsequent partial etch process. Additionally, the presence of the species can further increase the selectivity of the etch process between (i) the second conformal dielectric material 26 and (ii) the first isolation structures 24a and second isolation structures 24b. The species in some examples is carbon (C), nitrogen (N), hydrogen (H), fluorine (F), or other species.

After the treatment to reduce the loading effect and/or effect of seams 28 and 30 in operation 110, a partial etch process, as described above with respect to operation 108, is performed in operation 112. The cyclic partial etch and treatment processes in operation 110 and 112 may be repeatedly performed (e.g., as cycles) until a target depth of the partial etch and treatment process is obtained. The partial etch process and treatment process in operations 108, 110, and 112 may be performed in separate, respective tools and/or chambers, or may be performed in situ in a same chamber of a tool.

Figure 6A:
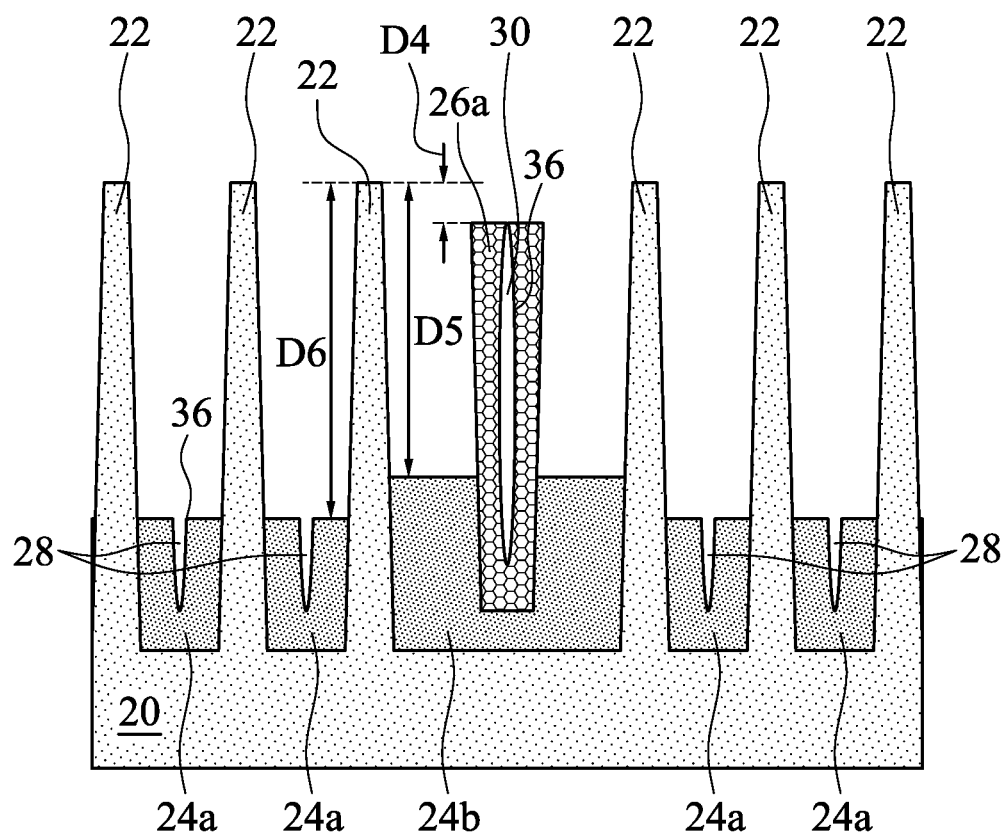
Figure 6B:
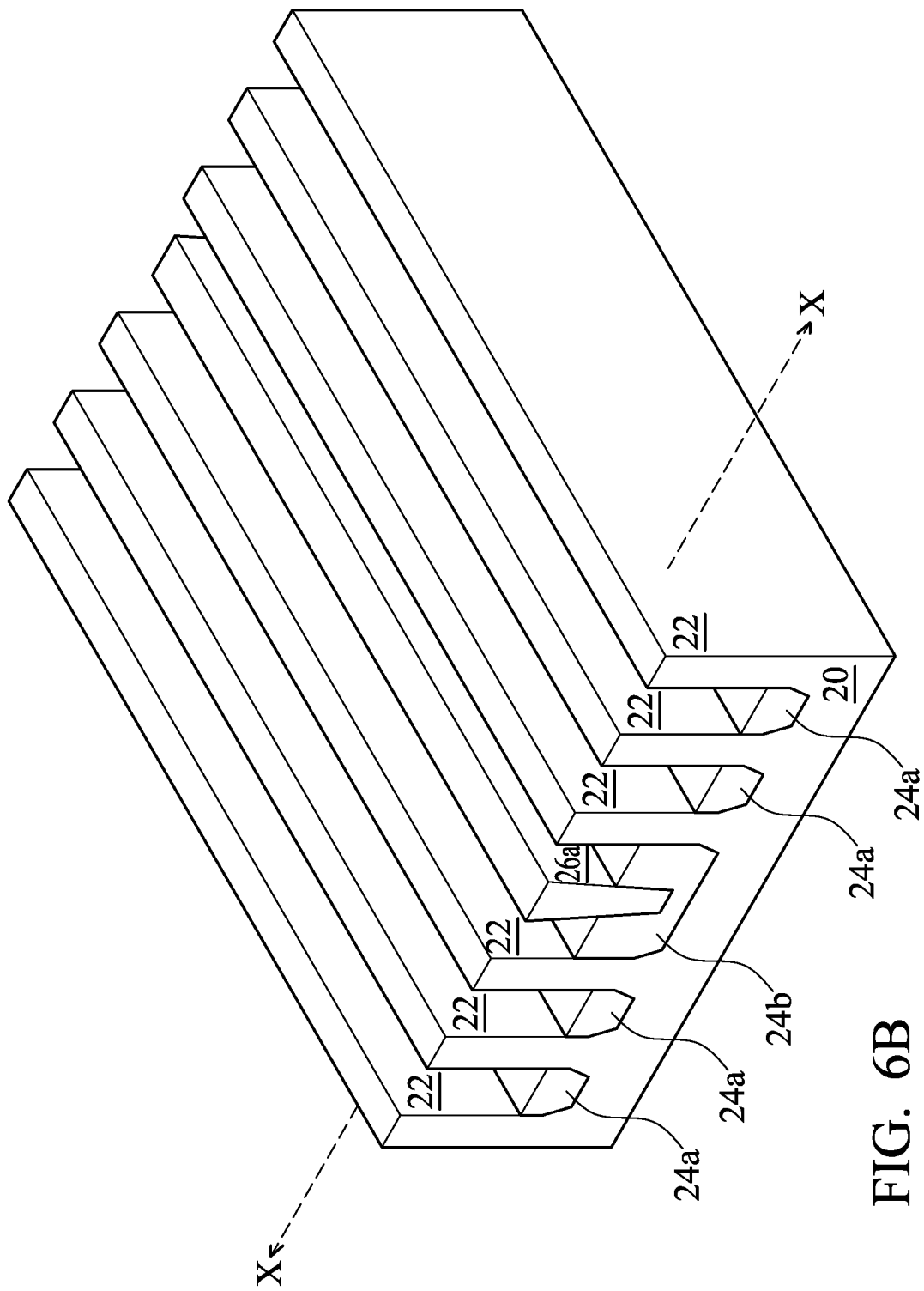
Figure 7:
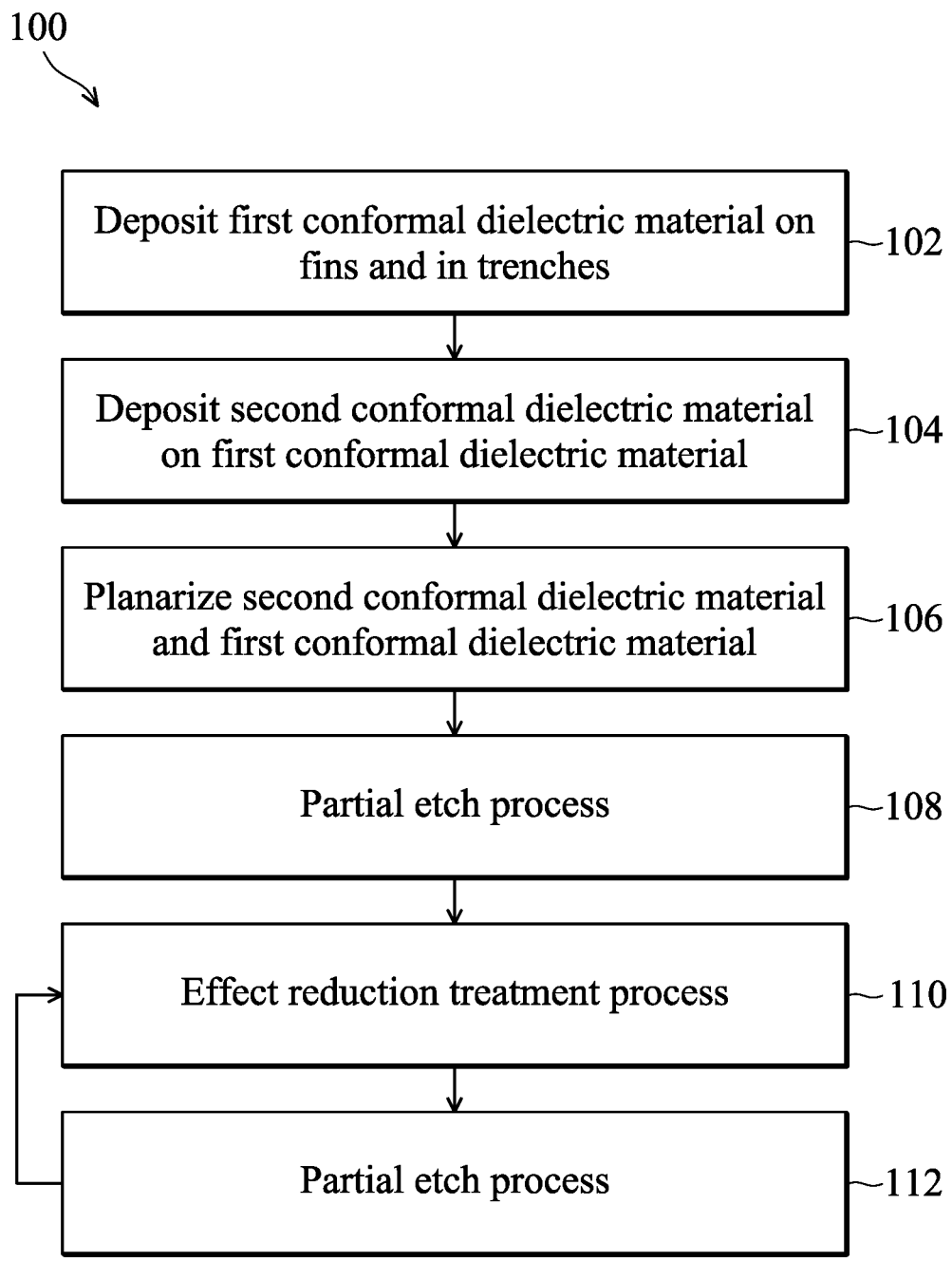
FIG. 7 is a flow chart of an example process for forming isolation structures and a dummy fin in accordance with some embodiments.

FIGS. 6A and 6B illustrate the first isolation structures 24a, the second isolation structure 24b, and the second conformal dielectric material 26 (which forms a dummy fin and is referred to hereinafter as dummy fin 26a) after the cyclic partial etch and treatment process. After the cyclic partial etch and treatment process, the second conformal dielectric material 26 protrudes from the semiconductor substrate 20 similar to the device fins 22, and hence, is considered a dummy fin 26a. FIG. 6A illustrates a cross-sectional view of the intermediate structure, and FIG. 6B is a perspective view of the intermediate structure. Cross-section X-X in FIG. 6B is at the same location as in FIG. 1B and is illustrated by FIG. 6A. For simplicity, seams 28 and 30 are not illustrated in FIG. 6B.

The cyclic partial etch and treatment process etches the dummy fin 26a to a fourth depth D4 from a top surface of the device fins 22, etches the second isolation structure 24b to a fifth depth D5 from the top surface of the device fins 22, and etches the first isolation structures 24a to a sixth depth D6. A ratio of the fifth depth D5 to the sixth depth D6, in some examples, is in a range from about 0.93 to about 1. As the ratio of the fifth depth D5 to the sixth depth D6 approaches 1, the loading effect is reduced. The fourth depth D4 indicates loss of the dummy fin 26a. A ratio of the fifth depth D5 to the fourth depth D4 can be greater than about 14, such as in a range from about 14 to about 56, and a ratio of the sixth depth D6 to the fourth depth D4 can be greater than about 15, such as in a range from about 15 to about 60. Increasing these ratios can indicate less loss of the dummy fin 26a.

As illustrated, the loading effect and/or effect of seams 28 and 30 can be reduced in accordance with some embodiments. Regarding the effects of seams, it is theorized that the species from the treatment process can reduce penetration of the etchant in the seam to thereby reduce etching from the seam. Regarding the loading effect, it is theorized that the treatment process has a similar loading effect such that the species from the treatment process diffuses into the materials at a greater rate in larger contiguous areas (e.g., upper surfaces of the first isolation structures 24a resulting from the first width W1) than in smaller areas (e.g., upper surfaces of the second isolation structure 24b resulting from the third width W3). The species from the treatment process that diffuses into these materials can alter the chemical composition of these materials and thereby reduce the etch rate of the materials. In some examples, since the species from the treatment process diffuses into the first isolation structures 24a at a greater rate than the species from the treatment process diffuses into the second isolation structure 24b, the etch rate of the first isolation structures 24a is reduced more than the etch rate of the second isolation structure 24b. This can offset the greater etch rate of the first isolation structures 24a that is caused by the loading effect.

In some examples, the species may remain in the seams 28 and 30 after the cyclic partial etch and treatment process. In other examples, the last etch process of the cyclic partial etch and treatment process can remove material with any remaining species, and hence, the species may be fully removed. When the species remains, a peak concentration of the species is at the respective seam 28 or 30. For example, a concentration of the species may increase in a lateral direction towards the respective seam 28 or 30 and may decrease continuing in the lateral direction away from the respective seam 28 or 30.

Tests were performed to illustrate an embodiment described herein. Two processes were performed—one with a treatment process and another without a treatment process. For ease of reference, the process without the treatment process is referred to herein as the point-of-reference (POR). Both processes implemented two partial etch processes. The process with the treatment process included the treatment process sequentially between the two partial etch processes. The treatment process included implementing a remote plasma with a CCP source at a power of 400 W and at a frequency of 13.56 MHz. The plasma process implemented carbon monoxide (CO) flowing at 100 sccm and hydrogen ($H_2$) flowing at 300 sccm, or at a ratio of 1:3. The pressure of the plasma process was 0.2 Torr, and the plasma process was performed at a temperature of 40° C.

The process implementing the treatment process had a reduced loss of the dummy fin (e.g., the fourth depth D4). The reduction of the loss was 0.4 Å, which represents a reduction of approximately 6.35%, relative to the POR process. The process implementing the treatment process had a reduced average etch depth of isolation structures (e.g., average of the fifth depth D5 and sixth depth D6). The reduction in average etch depth was 7.9 Å, which represents a reduction of approximately 7.41%, relative to the POR process. The process implementing the treatment process had a three-sigma value of 7 Å and a range of 9 Å for the etching rate/amount uniformity relative to the POR. The etch rate reduction by the surface treatment illustrate reduction of the loading effect and/or the effect of seams.

Figure 8A:
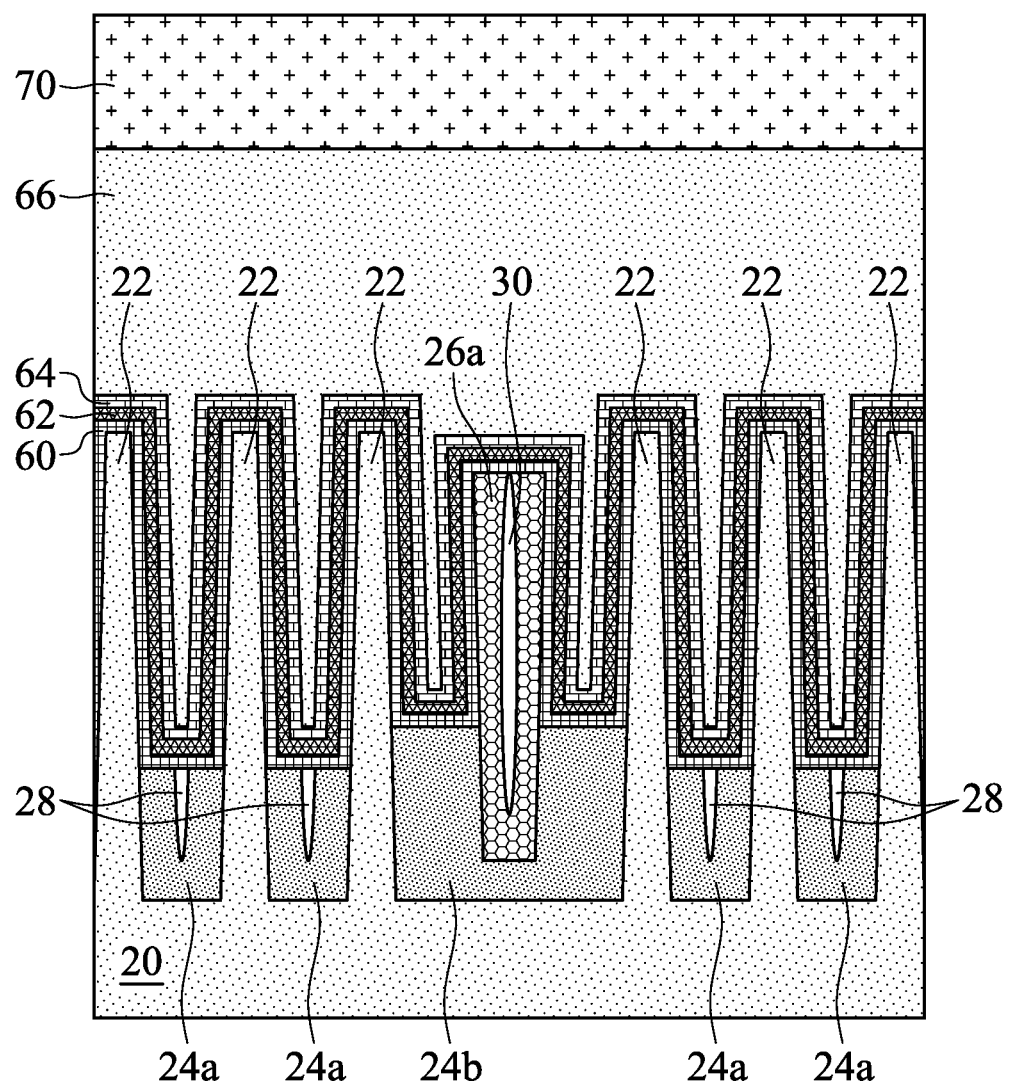
FIGS. 8A, 8B, and 8C illustrate various cross-sectional views of one or more FinFETs formed using the intermediate structure of FIGS. 6A and 6B in accordance with some embodiments.
Figure 8B:
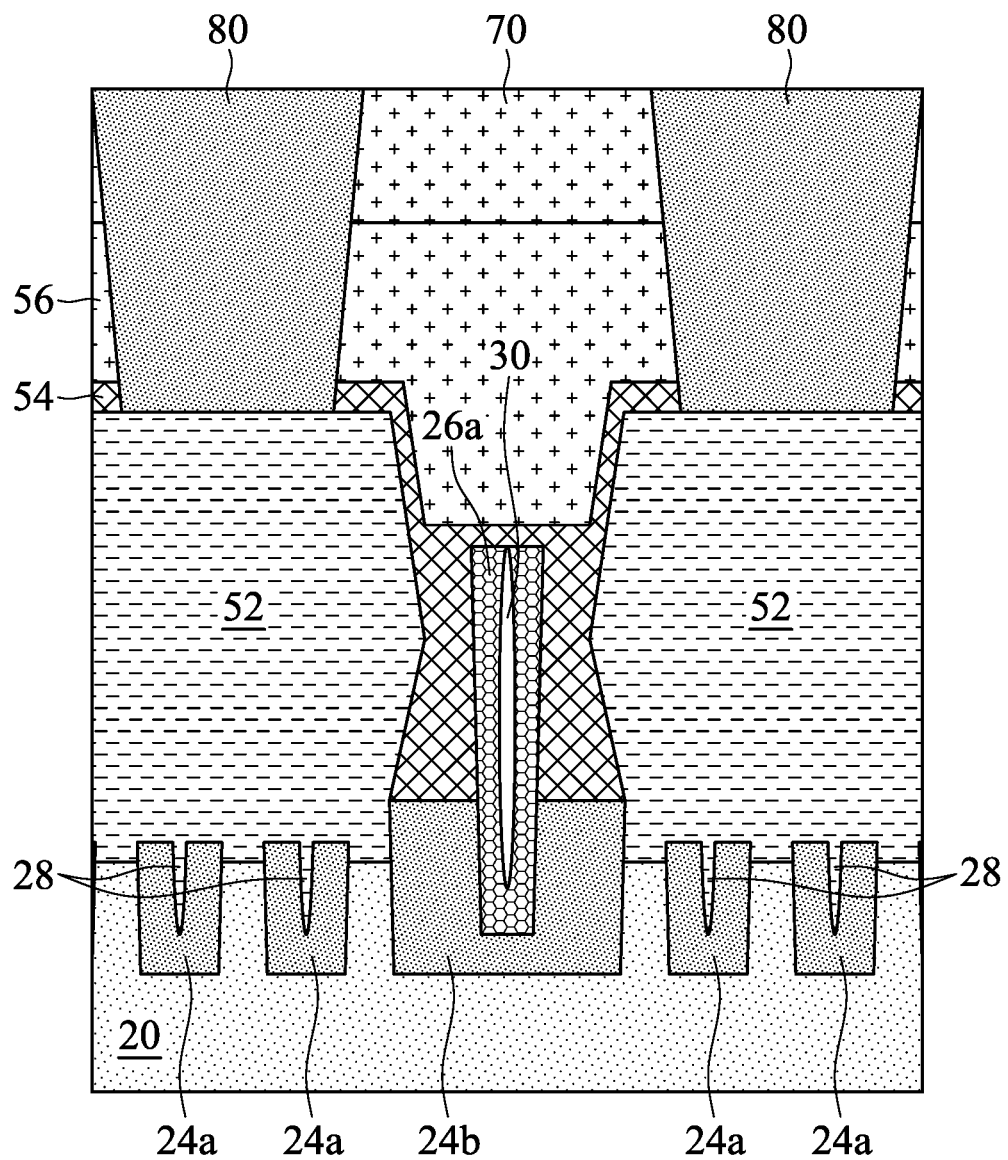
Figure 8C:
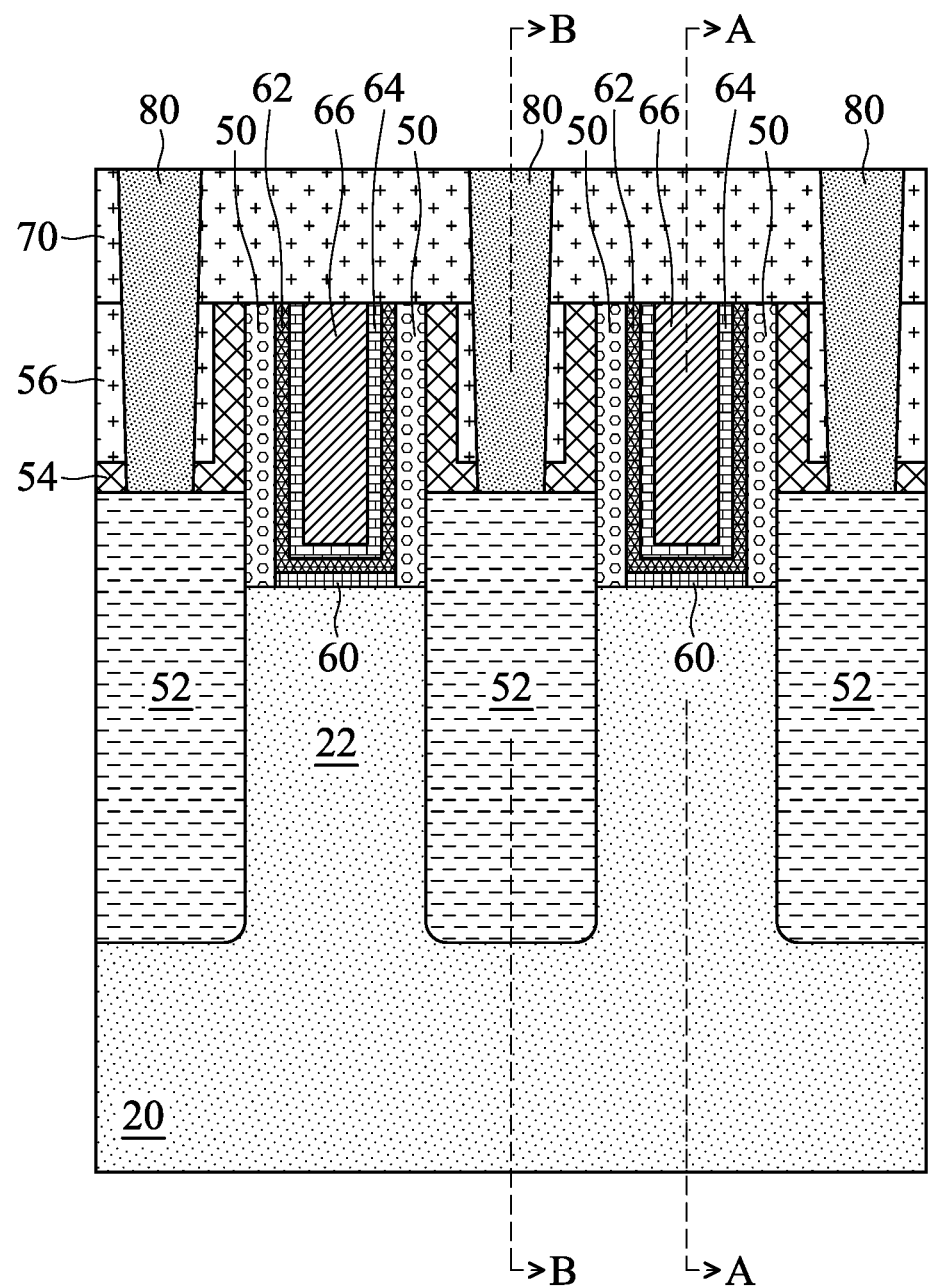

FIGS. 8A, 8B, and 8C illustrate various cross-sectional views of one or more FinFETs formed using the intermediate structure of FIGS. 6A and 6B. The cross-sectional views of FIGS. 8A and 8B are parallel to the cross section X-X in preceding figures. The cross-sectional view of FIG. 8A is across channel regions in device fins 22 and along a gate structure of one or more FinFETs. The cross-sectional view of FIG. 8B is across source/drain regions in device fins 22 of one or more FinFETs. The cross-sectional view of FIG. 8C is perpendicular to the cross section X-X in preceding figures and is along a device fin 22 and across gate structures of one or more FinFETs. A brief description of a replacement gate process to form the structure of FIGS. 8A, 8B, and 8C is provided to illustrate how various embodiments may be implemented. A person having ordinary skill in the art will readily understand additional details of such a process as well as modifications.

Dummy gate stacks (or more generally, gate structures) (not illustrated) are formed across the device fins 22, first isolation structures 24a, second isolation structure 24b, and dummy fin 26a of the structure of FIGS. 6A and 6B. The dummy gate stacks are formed where the gate structures illustrated in FIGS. 8A and 8C are formed, as will become apparent. The dummy gate stacks extend longitudinally perpendicularly to respective longitudinal directions of the device fins 22. Each dummy gate stack can include an interfacial dielectric along and on the device fins 22, a dummy gate over the interfacial dielectric, and a mask over the dummy gate.

The interfacial dielectrics may include or be silicon oxide, silicon nitride, the like, or multilayers thereof. The dummy gates may include or be silicon (e.g., polysilicon) or another material. The masks may include or be silicon nitride, silicon oxynitride, silicon carbon nitride, the like, or a combination thereof. Layers for the interfacial dielectrics, dummy gates, and masks for the dummy gate stacks may be sequentially deposited or formed, such as by any acceptable deposition technique, and then patterned, for example, using photolithography and one or more etch processes, into the dummy gate stacks.

Gate spacers 50 are formed along sidewalls of the dummy gate stacks and over the device fins 22. The gate spacers 50 may be formed by conformally depositing one or more layers for the gate spacers 50 and anisotropically etching the one or more layers, for example, by appropriate processes. The one or more layers for the gate spacers 50 may include or be silicon nitride, silicon oxynitride, silicon carbon nitride, the like, multi-layers thereof, or a combination thereof.

Recesses are then formed in the device fins 22 on opposing sides of the dummy gate stacks. The recessing can be by an etch process. The etch process can be isotropic or anisotropic, or further, may be selective with respect to one or more crystalline planes of the semiconductor substrate 20. Hence, the recesses can have various cross-sectional profiles based on the etch process implemented.

Epitaxial source/drain regions 52 are formed in the recesses. The epitaxial source/drain regions 52 may include or be silicon germanium, germanium, silicon carbide, silicon phosphorus, silicon carbon phosphorus, a III-V compound semiconductor, a II-VI compound semiconductor, or the like. The epitaxial source/drain regions 52 may be formed in the recesses by epitaxial growth with appropriate deposition processes. In some examples, epitaxial source/drain regions 52 may be formed with facets (which may correspond to crystalline planes of the semiconductor substrate 20), such as shown in FIG. 8B, and may be formed at a raised height with respect to the respective device fin 22, such as shown in FIG. 8C. In some examples, epitaxial source/drain regions 52 in some device fins 22 can be epitaxially grown to merge together, such as due to proximity to neighboring device fins 22. FIG. 8B illustrates an example where some epitaxial source/drain regions 52 merge to form a merged epitaxial source/drain regions 52. Other examples can include any combination of un-merged and merged epitaxial source/drain regions 52.

In some examples, the epitaxial source/drain regions 52 may also be doped, such as by in situ doping during epitaxial growth and/or by implanting dopants into the epitaxial source/drain regions 52 after epitaxial growth. Hence, a source/drain region may be delineated by doping (e.g., by in situ doping during epitaxial growth) and/or by epitaxial growth, which may further delineate the active area in which the source/drain region is delineated.

A contact etch stop layer (CESL) 54 is conformally deposited on surfaces of the epitaxial source/drain regions 52, sidewalls and top surfaces of the gate spacers 50, top surfaces of the masks, top surfaces of the second isolation structure 24b (and first isolation structures 24a, if exposed), and sidewalls and top surface of the dummy fin 26a. Generally, an etch stop layer can provide a mechanism to stop an etch process when forming, e.g., contacts or vias by having a different etch selectivity from adjacent layers or components. The CESL 54 may comprise or be silicon nitride, silicon carbon nitride, carbon nitride, the like, or a combination thereof, and may be deposited by any appropriate conformal deposition process.

A first interlayer dielectric (ILD) 56 is formed over the CESL 54. The first ILD 56 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The first ILD 56 may be deposited by any acceptable deposition process.

The first ILD 56 and CESL 54 are formed with top surfaces coplanar with top surfaces of the dummy gates, such as by a planarization process, such as a CMP. The CMP may also remove the masks (and, in some instances, upper portions of the gate spacers 50) on the dummy gates. Accordingly, top surfaces of the dummy gates are exposed through the first ILD 56 and the CESL 54. With the dummy gates exposed through the first ILD 56 and the CESL 54, the dummy gates are removed, such as by one or more acceptable etch processes. Recesses are formed between gate spacers 50 where the dummy gate stacks are removed, and channel regions of the device fins 22 are exposed through the recesses.

The replacement gate structures illustrated in FIGS. 8A and 8C are formed in the recesses where the dummy gate stacks were removed. The replacement gate structures each include, as illustrated, an interfacial dielectric 60, a gate dielectric layer 62, one or more optional conformal layers 64, and a gate conductive fill material 66. The interfacial dielectric 60, a gate dielectric layer 62, one or more optional conformal layers 64, and a gate conductive fill material 66 can be deposited by any appropriate deposition technique. The interfacial dielectric 60 is formed on sidewalls and top surfaces of the device fins 22 along the channel regions. The interfacial dielectric 60 can be, for example, the interfacial dielectric of the dummy gate stack if not removed, an oxide (e.g., silicon oxide), a nitride (e.g., silicon nitride), and/or another dielectric layer. The interfacial dielectric 60, or a subsequently deposited dielectric layer, is along sidewall and top surfaces of the device fins 22 and the dummy fin 26a, and on top surfaces of the first isolation structures 24a and second isolation structures 24b.

The gate dielectric layer 62 can be conformally deposited in the recesses where dummy gate stacks were removed (e.g., on sidewall and top surfaces of the device fins 22 and the dummy fin 26a, and on top surfaces of the first isolation structures 24a and second isolation structures 24b) and on the top surfaces of the first ILD 56, the CESL 54, and gate spacers 50. The gate dielectric layer 62 can be or include silicon oxide, silicon nitride, a high-k dielectric material, multilayers thereof, or other dielectric material. A high-k dielectric material may include a metal oxide of or a metal silicate of hafnium (Hf), aluminum (Al), zirconium (Zr), lanthanum (La), magnesium (Mg), barium (Ba), titanium (Ti), lead (Pb), or a combination thereof.

Then, the one or more optional conformal layers 64 can be conformally (and sequentially, if more than one) deposited on the gate dielectric layer 62. The one or more optional conformal layers 64 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 66 is formed over the one or more optional conformal layers 64, if implemented, and/or the gate dielectric layer 62. The gate conductive fill material 66 can fill remaining recesses where the dummy gate stacks were removed. The gate conductive fill material 66 may be or comprise a metal-containing material such as tungsten, cobalt, aluminum, ruthenium, copper, multi-layers thereof, a combination thereof, or the like. A planarization process, such as a CMP, may remove excess gate conductive fill material 66, one or more optional conformal layers 64, and gate dielectric layer 62. The replacement gate structures comprising the gate conductive fill material 66, one or more optional conformal layers 64, gate dielectric layer 62, and interfacial dielectric 60 may therefore be formed as illustrated in FIGS. 8A and 8C.

A second ILD 70 is formed over the first ILD 56, CESL 54, gate spacers 50, and replacement gate structures. The second ILD 70 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 70 may be deposited by any appropriate deposition process.

Respective openings are formed through the second ILD 70, the first ILD 56, and the CESL 54 to expose at least a portion of respective epitaxial source/drain regions 52. The second ILD 70, the first ILD 56, and the CESL 54 may be patterned with the openings, for example, using photolithography and one or more etch processes.

After the formation of the source/drain contact openings, conductive features 80 are formed in the openings to the epitaxial source/drain regions 52. The conductive features 80 may include a silicide region formed on the epitaxial source/drain regions 52, an adhesion and/or barrier layer, and a conductive fill material on the adhesion and/or barrier layer. The silicide region may be formed by thermally reacting an upper portion of the epitaxial source/drain regions 52 with a metal layer (not shown), such as titanium, tantalum, or the like, formed on the epitaxial source/drain regions 52. The adhesion and/or barrier layer is conformally deposited in the openings. The adhesion and/or barrier layer may be or include titanium nitride, titanium oxide, tantalum nitride, tantalum oxide, any suitable transition metal nitrides or oxides, the like, or any combination thereof, and may be deposited by any suitable deposition technique. The conductive fill material may be or include cobalt, tungsten, copper, ruthenium, aluminum, gold, silver, alloys thereof, the like, or a combination thereof, and may be deposited by any suitable deposition technique. After the conductive material is deposited, excess conductive fill material and adhesion and/or barrier layer may be removed by using a planarization process, such as a CMP. The conductive features 80 may be referred to as contacts, plugs, etc.

Figure 9A:
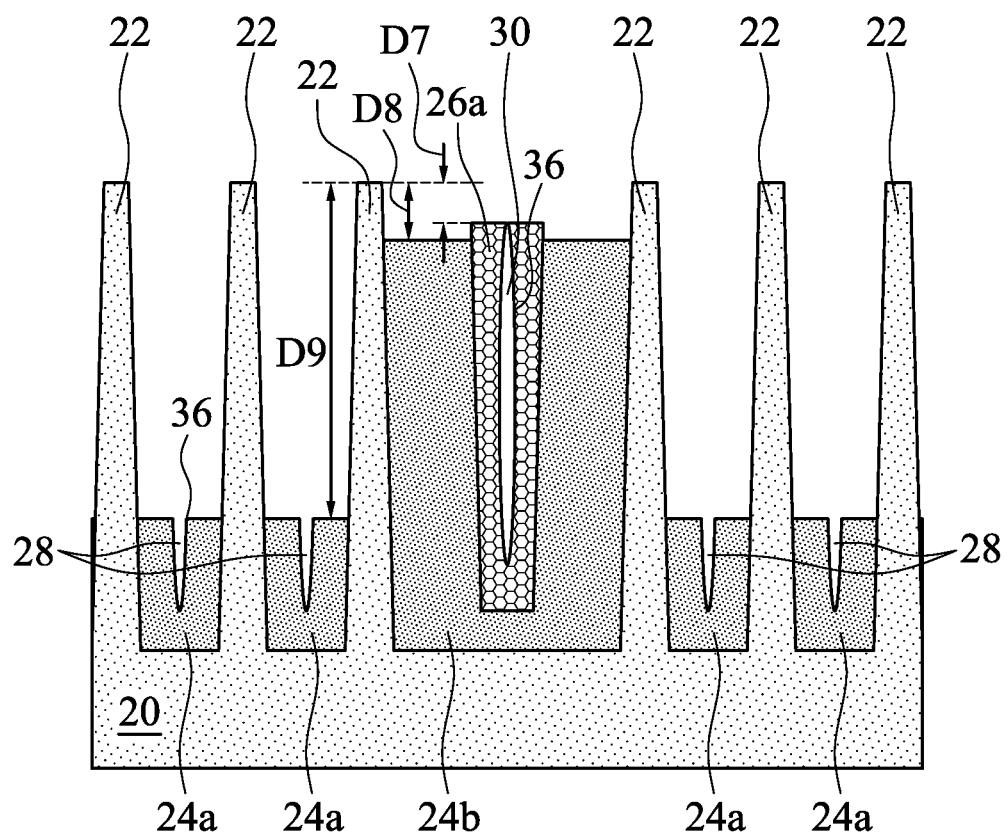
FIGS. 9A and 9B illustrate cross-sectional and perspective views of an intermediate structure at a stage during another example process for forming isolation structures and a dummy fin for FinFETs in accordance with some embodiments.
Figure 9B:
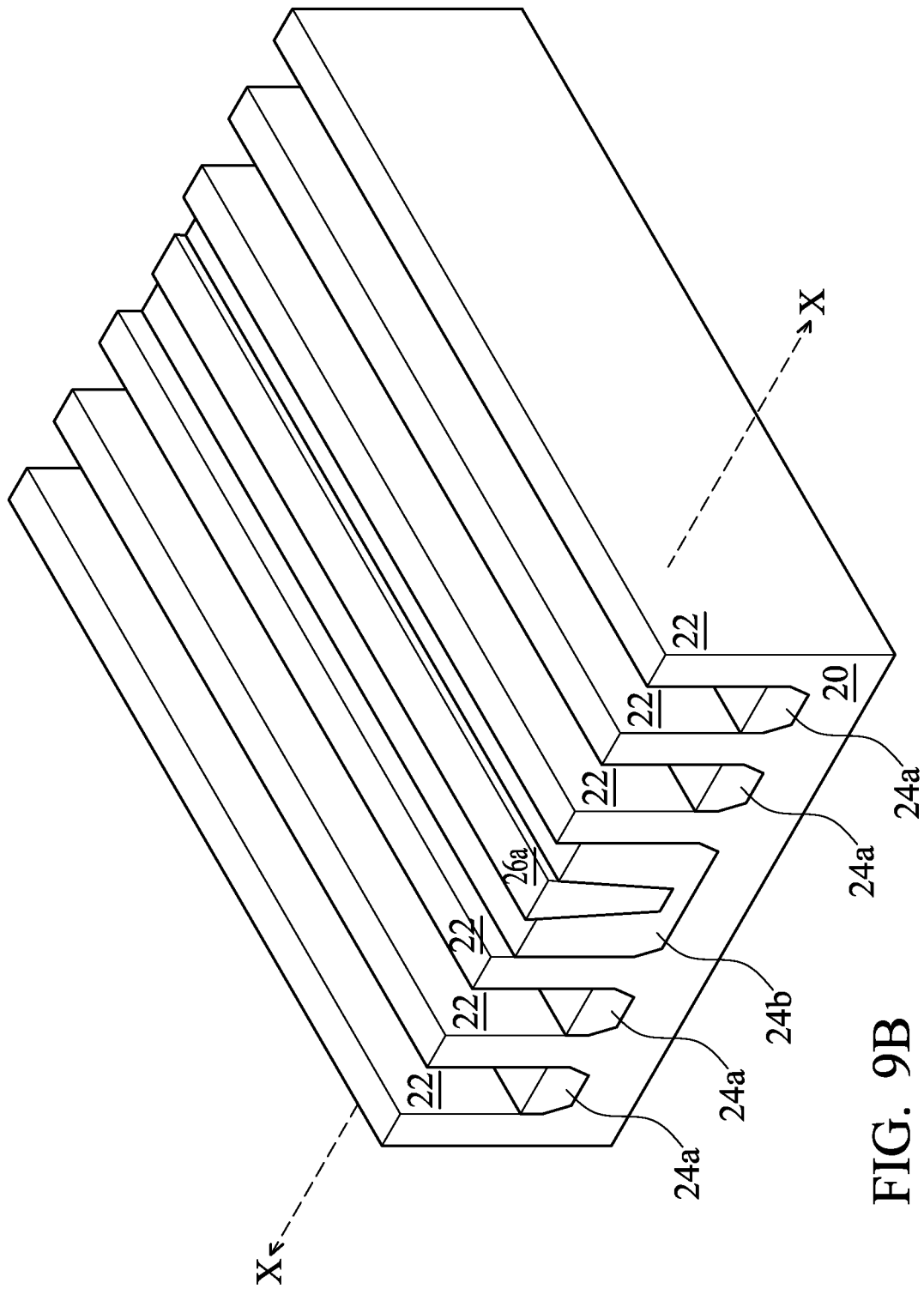
Figure 10:
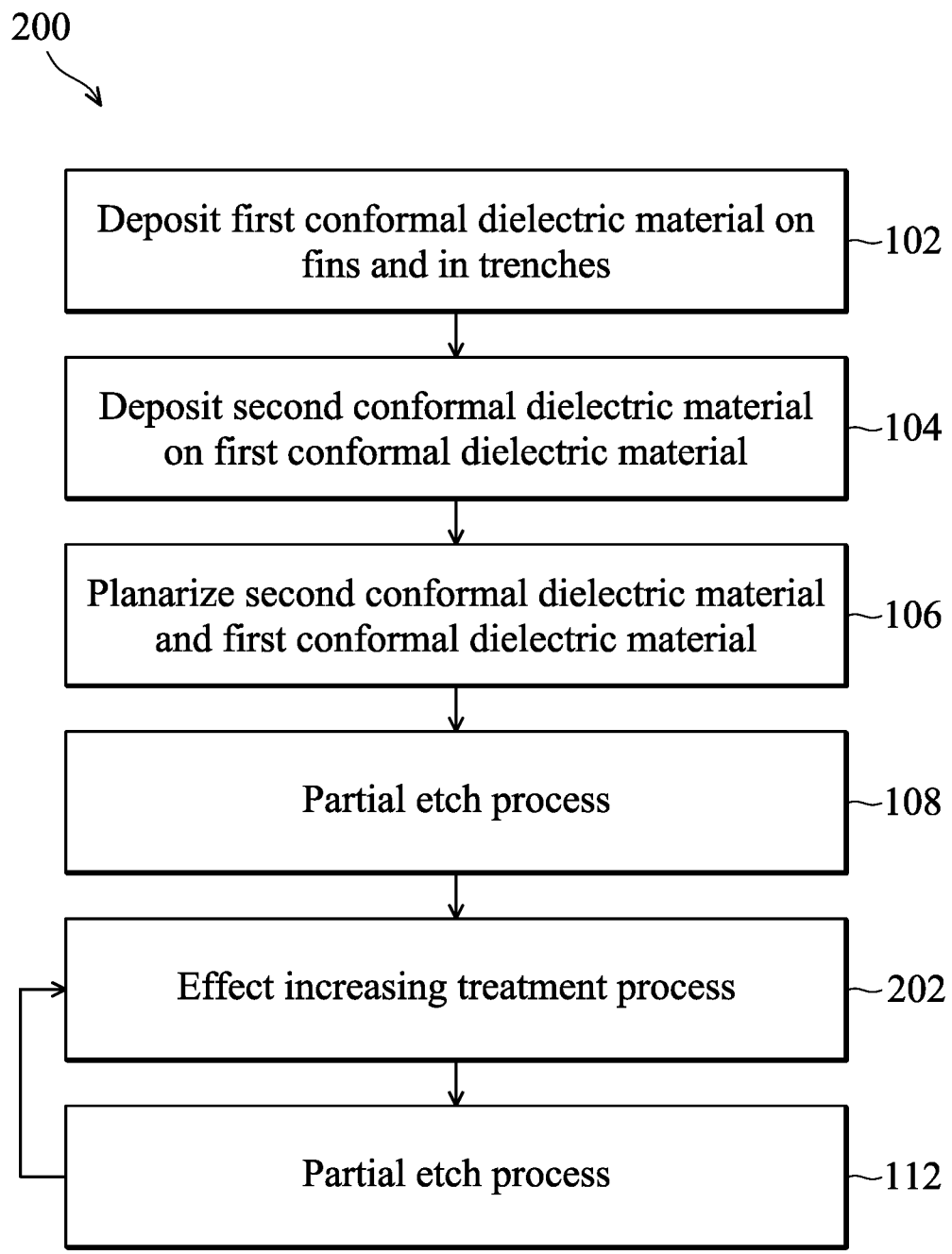
FIG. 10 is a flow chart of an example process for forming isolation structures and a dummy fin in accordance with some embodiments.

FIGS. 9A and 9B illustrate cross-sectional and perspective views of an intermediate structure at a stage during another example process for forming isolation structures and a dummy fin for FinFETs in accordance with some embodiments. FIG. 10 is a flow chart of the example process 200 for forming the isolation structures and the dummy fin in accordance with some embodiments.

Operations 102, 104, 106, and 108 of the process 200 are performed as previously described with respect to FIGS. 1A-1B and 2 through 4. As with the preceding description, FIGS. 4 and 5 illustrate a cyclic partial etch and treatment process. The treatment process in operation 202 of the process results in a similar structure as illustrated in FIG. 5 with a different species.

In operation 202 of the process 200, and as illustrated in FIG. 5, a treatment process is performed to treat exposed surfaces 36 of the first isolation structures 24a, the second isolation structures 24b, and the second conformal dielectric material 26. In some examples, the treatment process increases the loading effect and/or the effect of seams 28 and 30 being present during the subsequent etch process. The treatment process includes a plasma process in some examples. In some examples, the plasma process includes a remote plasma with a CCP source. Example gases used to implement the plasma process include oxygen ($O_2$), steam ($H_2O$), the like, or a combination thereof, which may further include a carrier gas such as argon (Ar), hydrogen ($H_2$), or the like. A pressure of the plasma process can be in a range from about 1 Torr to about 5 Torr, and a temperature of the plasma process can be in a range from about 20° C. to about 200° C., such as about room temperature (e.g., 23° C.). A power of the CCP source can be in a range from about 100 W to about 400 W at an appropriate frequency, such as 13.56 MHz. Parameters of the plasma process may be tuned, to amounts within or outside of ranges described above, to obtain different results, such as the depth to which a species diffuses into a material, which can have an effect on a subsequent etch process.

The plasma process causes a species to be at the exposed surfaces 36 of the first isolation structures 24a, second isolation structure 24b, and second conformal dielectric material 26 and diffused a depth from those exposed surfaces 36 in the respective structures. The presence of the species at the exposed surfaces 36 and to some depth from the exposed surfaces 36 increases the loading effect and/or the effect of seams 28 and 30 being present during the subsequent etch process. The presence of the species increases the etch rates of the first isolation structures 24a, second isolation structure 24b, and second conformal dielectric material 26 in the subsequent partial etch process compared to when the species from the treatment is absent. However, due to different sizes of surface areas of the first isolation structures 24a and second isolation structure 24b, a ratio of the etch rate of the second isolation structure 24b to the etch rate of the first isolation structure 24a decreases due to the presence of the species in the subsequent partial etch process. Additionally, the presence of the species can further reduce the selectivity of the etch process between (i) the second conformal dielectric material 26 and (ii) the first isolation structures 24a and second isolation structures 24b. The species implemented in the plasma process, in some examples, is oxygen (O) or other species, which may be dissociated from a gas, such as oxygen (O2) or other gas.

After the treatment to increase the loading effect and/or effect of seams 28 and 30 in operation 202, a partial etch process, as described above with respect to operation 108, is performed in operation 112. The cyclic partial etch and treatment processes in operation 110 and 112 may be repeatedly performed (e.g., as cycles) until a target depth of the partial etch and treatment process is obtained. The partial etch process and treatment process in operations 108, 110, and 112 may be performed in separate, respective tools and/or chambers, or may be performed in situ in a same chamber of a tool.

FIGS. 9A and 9B illustrate the first isolation structures 24a, the second isolation structure 24b, and the second conformal dielectric material 26 (which forms a dummy fin and is referred to hereinafter as dummy fin 26a) after the cyclic partial etch and treatment process. FIG. 9A illustrates a cross-sectional view of the intermediate structure, and FIG. 9B is a perspective view of the intermediate structure. Cross-section X-X in FIG. 9B is at the same location as in FIG. 1B and is illustrated by FIG. 9A. For simplicity, seams 28 and 30 are not illustrated in FIG. 9B.

The cyclic partial etch and treatment process etches the dummy fin 26a to a seventh depth D7 from a top surface of the device fins 22, etches the second isolation structure 24b to an eighth depth D8 from the top surface of the device fins 22, and etches the first isolation structures 24a to a ninth depth D9. A ratio of the eighth depth D8 to the ninth depth D9, in some examples, is in a range from about 0 to about 0.25. As the ratio of the eighth depth D8 to the ninth depth D9 approaches 0, the loading effect is increased. The seventh depth D7 indicates loss of the dummy fin 26a. A ratio of the eighth depth D8 to the seventh depth D7 can be less than about 30, such as in a range from about 7.5 to about 30, and a ratio of the ninth depth D9 to the seventh depth D7 can be less than about 60, such as in a range from about 15 to about 60. Decreasing these ratios can indicate more loss of the dummy fin 26a.

As illustrated, the loading effect and/or effect of seams 28 and 30 can be increased in accordance with some embodiments. Regarding the effects of seams, it is theorized that the species from the treatment process can increase penetration of the etchant in the seam by creating a composition of material at the seam that has a higher etch rate to thereby increase etching from the seam. Regarding the loading effect, it is theorized that the treatment process has a similar loading effect such that the species from the treatment process diffuses into the materials at a greater rate in larger contiguous areas (e.g., upper surfaces of the first isolation structures 24a resulting from the first width W1) than in smaller areas (e.g., upper surfaces of the second isolation structure 24b resulting from the third width W3). The species from the treatment process that diffuses into these materials can alter the chemical composition of these materials and thereby increase the etch rate of the materials. In some examples, since the species from the treatment process diffuses into the first isolation structures 24a at a greater rate than the species from the treatment process diffuses into the second isolation structure 24b, the etch rate of the first isolation structures 24a is increased more than the etch rate of the second isolation structure 24b. This can boost the greater etch rate of the first isolation structures 24a that is caused by the loading effect.

In some examples, the species may remain in the seams 28 and 30 after the cyclic partial etch and treatment process. In other examples, the last etch process of the cyclic partial etch and treatment process can remove material with any remaining species, and hence, the species may be fully removed. When the species remains, a peak concentration of the species is at the respective seam 28 or 30. For example, a concentration of the species may increase in a lateral direction towards the respective seam 28 or 30 and may decrease continuing in the lateral direction away from the respective seam 28 or 30.

Tests were performed to illustrate an embodiment described herein. Two processes were performed—one with a treatment process and another without a treatment process. For ease of reference, the process without the treatment process is referred to herein as the POR. Both processes implemented two partial etch processes. The partial etch processes were each a gas etch process using a mix of hydrofluoric (HF) acid gas and ammonia ($NH_3$) gas at flow rates of 165 sccm and 150 sccm, respectively. A pressure of the partial etch processes was 3 Torr, and a temperature of the partial etch processes was 30° C.

The process with the treatment process included the treatment process sequentially between the two partial etch processes. The treatment process included implementing a remote plasma with a CCP source at a power of 3000 W and a frequency of 13.56 MHz. The plasma process implemented oxygen ($O_2$) flowing at 250 sccm. The pressure of the plasma process was 0.7 Torr, and the plasma process was performed at 200° C.

The process implementing the treatment process had an increased loss of the dummy fin (e.g., the seventh depth D7). The increased loss was 25.3 nm, which represents an increase of approximately 152%, relative to the POR process. The process implementing the treatment process had an increased etch depth of first isolation structures 24a (e.g., the ninth depth D9). The increase in etch depth was at least 32.2 nm, which represents an increase of approximately 53%, relative to the POR process. The implementing the treatment process may have an even greater increased etch depth of first isolation structures 24a because the isolation structures 24a were completely removed in some instances. The process implementing the treatment process had an increased etch depth of second isolation structures 24b (e.g., the eighth depth D8). The increase in etch depth was 14.7 nm, which represents an increase of approximately 29%, relative to the POR process. The difference between the etch depth of first isolation structures 24a (e.g., the ninth depth D9) and the etch depth of second isolation structures 24b (e.g., the eighth depth D8) was at least 28.1 nm, which represents an increase of approximately 193% relative to the POR process. The increase in this difference illustrates increasing of the loading effect and/or the effect of seams.

Figure 11A:
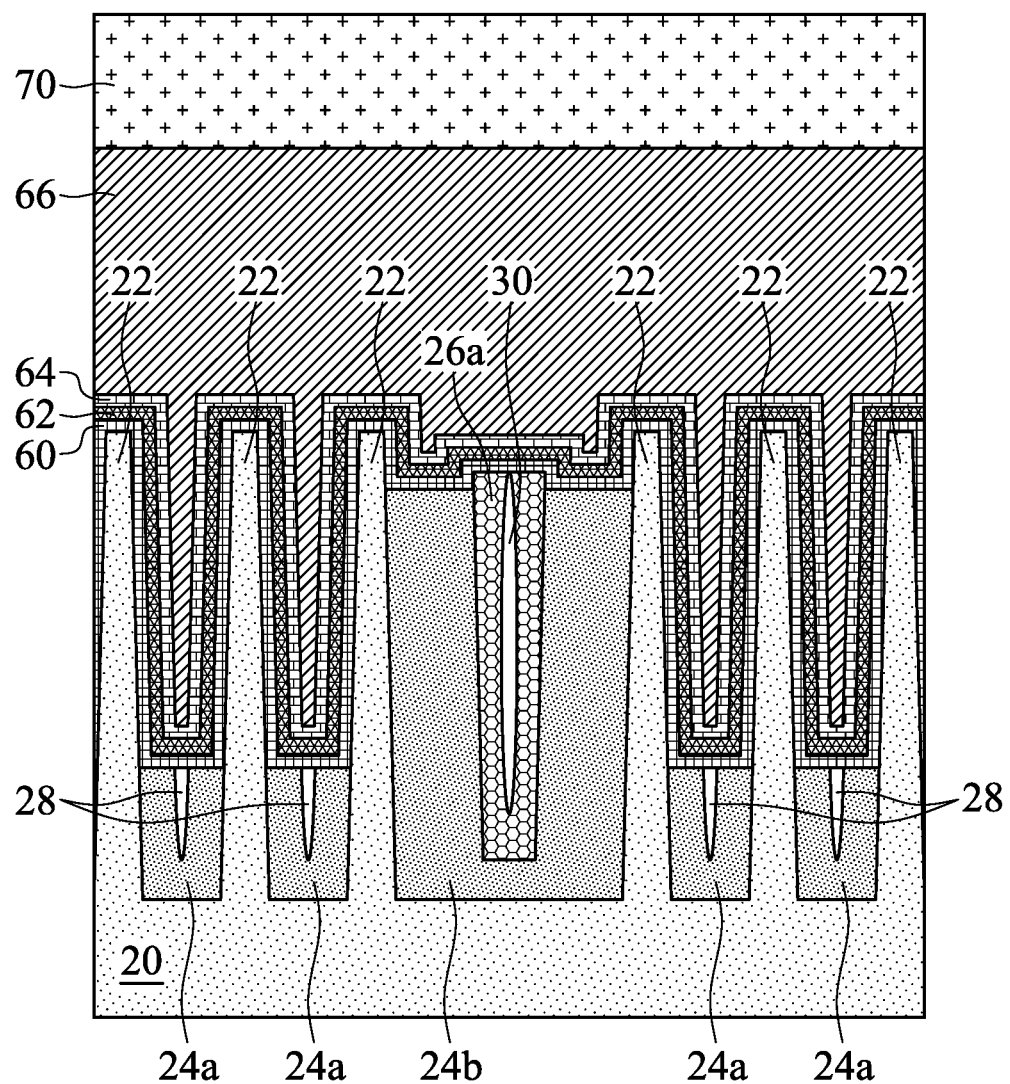
FIGS. 11A and 11B illustrate various cross-sectional views of one or more FinFETs formed using the intermediate structure of FIGS. 9A and 9B in accordance with some embodiments.
Figure 11B:
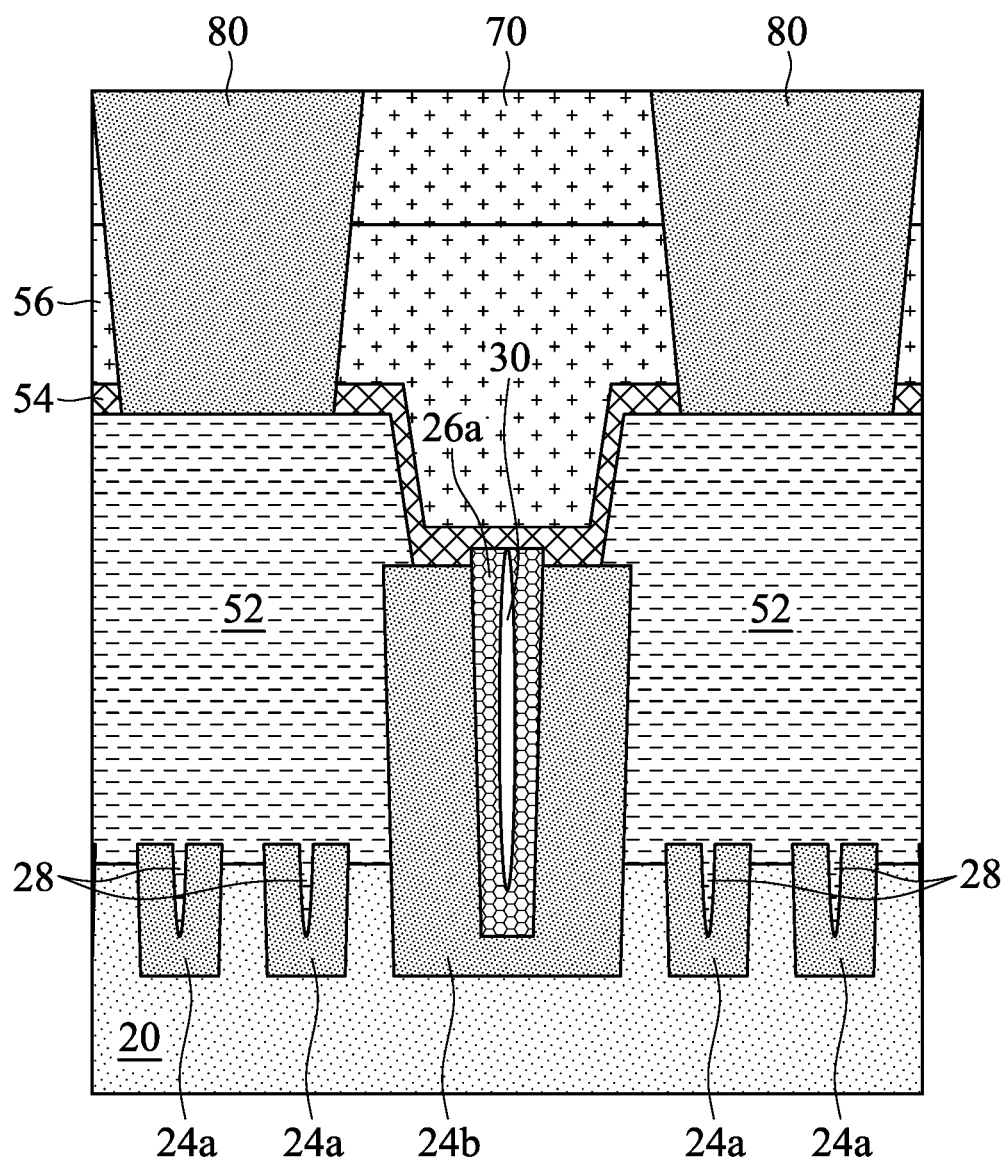

FIGS. 11A and 11B illustrate various cross-sectional views of one or more FinFETs formed using the intermediate structure of FIGS. 9A and 9B. The cross-sectional views of FIGS. 11A and 11B are parallel to the cross section X-X in preceding figures. The cross-sectional view of FIG. 11A is across channel regions in device fins 22 and along a gate structure of one or more FinFETs. The cross-sectional view of FIG. 11B is across source/drain regions in device fins 22 of one or more FinFETs. Although not specifically illustrated in the context of FIGS. 11A and 11B, the cross-sectional view of FIG. 8C (which is perpendicular to the cross section X-X in preceding figures, is along a device fin 22, and is across gate structures of one or more FinFETs) is the same for the structure of FIGS. 11A and 11B. A brief description of a replacement gate process to form the structure of FIGS. 11A and 11B is the same as described previously and is omitted here for brevity.

Some embodiments can achieve advantages. Some embodiments implement a treatment process to tune etching effects that can result from various factors. In some examples, a loading effect and/or effect of the presence of seams in isolation structures can be reduced, which can result in more uniform fin heights extending above the isolation structures, such as shown in FIG. 6A. The more uniform fin heights can permit more uniform operation of FinFETs since the physical characteristics of the device fins may be more uniform. In some examples, a loading effect and/or effect of the presence of seams in isolation structures can be increased, which can result in various fin heights extending above the isolation structures, such as shown in FIG. 9A. The various fin heights can permit tuning of channel widths to tune operation of FinFETs, for example.

An embodiment is a method of semiconductor processing. A first dielectric material is conformally deposited in a first trench in a substrate, and in a second trench in the substrate. Merged lateral growth fronts of the first dielectric material in the first trench form a seam in the first trench. The first dielectric material in the first trench and the first dielectric material in the second trench are treated. The first dielectric material in the first trench has a first upper surface. The first dielectric material in the second trench has a second upper surface. The treating causes a species to be on the first upper surface and the second upper surface, to be in the seam, and to diffuse into the first dielectric material in the first trench and into the first dielectric material in the second trench. After the treating, the first dielectric material in the first trench and the first dielectric material in the second trench are etched. A ratio of a first etch rate of the first dielectric material in the second trench to a second etch rate of the first dielectric material in the first trench is altered by presence of the species in the first dielectric material during the etching.

Another embodiment is a structure. The structure includes a substrate having a first device fin, a second device fin, and a third device fin. A first sidewall of the first device fin faces a sidewall of the second device fin, and a second sidewall of the first device fin faces a sidewall of the third device fin. A first width from the first sidewall of the first device fin to the sidewall of the second device fin is less than a second width from the second sidewall of the first device fin to the sidewall of the third device fin. The structure includes a first isolation structure disposed between the first sidewall of the first device fin and the sidewall of the second device fin. A first dimension is from an upper surface of the first isolation structure to an upper surface of the first device fin. The structure also includes a second isolation structure disposed between the second sidewall of the first device fin and the sidewall of the third device fin. A second dimension is from an upper surface of the second isolation structure to the upper surface of the first device fin, and a ratio of the second dimension to the first dimension is in a range from 0.93 to 1. The structure further includes a dummy fin on the second isolation structure and between the second sidewall of the first device fin and the sidewall of the third device fin. A sidewall of the dummy fin faces the second sidewall of the first device fin. A third width is from the second sidewall of the first device fin to the sidewall of the dummy fin. The third width is less than the first width.

A further embodiment is a structure. The structure includes a substrate having a first device fin, a second device fin, and a third device fin. A first sidewall of the first device fin faces a sidewall of the second device fin, and a second sidewall of the first device fin faces a sidewall of the third device fin. A first width from the first sidewall of the first device fin to the sidewall of the second device fin is less than a second width from the second sidewall of the first device fin to the sidewall of the third device fin. The structure includes a first isolation structure disposed between the first sidewall of the first device fin and the sidewall of the second device fin. A first dimension is from an upper surface of the first isolation structure to an upper surface of the first device fin. The structure also includes a second isolation structure disposed between the second sidewall of the first device fin and the sidewall of the third device fin. A second dimension is from an upper surface of the second isolation structure to the upper surface of the first device fin, and a ratio of the second dimension to the first dimension is in a range from 0 to 0.25. The structure further includes a dummy fin on the second isolation structure and between the second sidewall of the first device fin and the sidewall of the third device fin. A sidewall of the dummy fin faces the second sidewall of the first device fin. A third width is from the second sidewall of the first device fin to the sidewall of the dummy fin. The third width is less than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor processing, the method comprising:
    conformally depositing a first dielectric material in a first trench in a substrate and in a second trench in the substrate, wherein merged lateral growth fronts of the first dielectric material in the first trench form a seam in the first trench;
    conformally depositing a second dielectric material in the second trench, the second dielectric material being deposited on the first dielectric material;
    planarizing the first dielectric material and the second dielectric material, wherein after the planarizing, the second dielectric material forms a dielectric fin in the second trench;
    treating the first dielectric material in the first trench and the first dielectric material in the second trench and the dielectric fin in the second trench, the first dielectric material in the first trench having a first upper surface, the first dielectric material in the second trench having a second upper surface, the treating causing a species to be on the first upper surface and the second upper surface, to be in the seam, and to diffuse into the first dielectric material in the first trench and into the first dielectric material in the second trench;
    after the treating, etching the first dielectric material in the first trench and the first dielectric material in the second trench and the dielectric fin in the second trench, wherein a ratio of a first etch rate of the first dielectric material in the second trench to a second etch rate of the first dielectric material in the first trench is altered by presence of the species in the first dielectric material during the etching; and
    forming a gate structure over the first dielectric material in the first trench and the first dielectric material in the second trench and the dielectric fin in the second trench, the gate structure physically contacting two sidewalls and a top surface of the dielectric fin in the second trench.

2. The method of claim 1 further comprising repeatedly performing the treating and the etching.

3. The method of claim 1, wherein the treating includes a plasma process.

4. The method of claim 1, wherein the species decreases the first etch rate and the second etch rate, the ratio of the first etch rate to the second etch rate being increased by the presence of the species in the first dielectric material during the etching.

5. The method of claim 1, wherein the species increases the first etch rate and the second etch rate, the ratio of the first etch rate to the second etch rate being decreased by the presence of the species in the first dielectric material during the etching.

6. The method of claim 1, wherein depositing the first dielectric material includes merging lateral growth fronts of the first dielectric material in the first trench to form a seam in the first trench, wherein no lateral growth front of the first dielectric material merges with another lateral growth front of the first dielectric material in the second trench.

7. The method of claim 1, wherein the treating causing the species to be on a third upper surface of the dielectric fin and to diffuse into the dielectric fin, wherein a third etch rate of the dielectric fin is altered by presence of the species in the dielectric fin during the etching.

8. The method of claim 7, wherein the species decreases the third etch rate.

9. The method of claim 7, wherein the species increases the third etch rate.

10. The method of claim 1, wherein a contiguous width of the first upper surface is greater than a contiguous width of the second upper surface.

11. A method of semiconductor processing, the method comprising:
    depositing a first dielectric material in a first trench in a substrate and in a second trench in the substrate, the first dielectric material in the first trench having a first void, all outer surfaces of the first void being formed by the first dielectric material;
    depositing a second dielectric material in the second trench in the substrate, the second dielectric material in the second trench having a second void, all outer surfaces of the second void being formed by the second dielectric material;
    planarizing the first dielectric material and the second dielectric material, wherein after the planarizing, top surfaces of the first dielectric material, the second dielectric material, and the substrate are coplanar;
    after the planarizing, performing one or more treatment-etch cycles, wherein each treatment-etch cycle comprises:
        performing a plasma process to introduce a species to the first dielectric material and the second dielectric material; and
        after performing the plasma process, etching the first dielectric material, wherein a ratio of a first etch rate of the first dielectric material in the second trench to a second etch rate of the first dielectric material in the first trench is altered by presence of the species in the first dielectric material during the etching, wherein after the etching, the second dielectric material in the second trench has a top surface higher than a topmost surface of the first dielectric material in the second trench.

12. The method of claim 11, wherein the species comprises carbon, nitrogen, hydrogen, or fluorine.

13. The method of claim 11, wherein the species comprises oxygen.

14. The method of claim 11, wherein the etching comprises an isotropic etch process.

15. A method of semiconductor processing, the method comprising:
    depositing a first dielectric material in a first trench in a substrate and in a second trench in the substrate, wherein the first trench has a first width and the second trench has a second width, the first width being smaller than the second width, the first dielectric material having a first thickness, the first thickness being at least half the first width, the first dielectric material in the first trench having a void;
    depositing a second dielectric material over the first dielectric material in the second trench, the second dielectric material having a second thickness, the second thickness being at least half of the second width not filled by the first dielectric material, the second dielectric material in the second trench having a void;
    treating the first dielectric material in the first trench, the first dielectric material in the second trench, and the second dielectric material in the second trench, wherein treating diffuses a species into the first dielectric material in the first trench, the first dielectric material in the second trench, and the second dielectric material in the second trench; and
    after the treating, etching the first dielectric material in the first trench, the first dielectric material in the second trench, and the second dielectric material in the second trench, wherein after the etching, the second dielectric material in the second trench has a top surface higher than a topmost surface of the first dielectric material in the second trench.

16. The method of claim 15 further comprising repeating treating and etching one or more times.

17. The method of claim 15 further comprising forming a replacement gate structure over the second dielectric material, wherein the replacement gate structure physically contacts a top surface and sidewalls of the second dielectric material.

18. The method of claim 1, wherein the second dielectric material in the second trench has a void.

19. The method of claim 11 further comprising:
    forming a gate structure over the first dielectric material in the first trench and the first dielectric material in the second trench and the second dielectric material in the second trench, the gate structure physically contacting two sidewalls and a top surface of the second dielectric material in the second trench.

20. The method of claim 19, wherein the gate structure physically contacts the first dielectric material in the first trench.

* * * * *